(12) United States Patent
Xu et al.

(10) Patent No.: US 10,855,405 B2
(45) Date of Patent: Dec. 1, 2020

(54) RETRANSMISSION TECHNIQUES FOR ENCODED TRANSMISSIONS

(71) Applicant: QUALCOMM Incorporated, San Diego, CA (US)

(72) Inventors: Changlong Xu, Beijing (CN); Jian Li, Beijing (CN); Chao Wei, Beijing (CN); Chong Li, Weehawken, NJ (US); Joseph Binamira Soriaga, San Diego, CA (US); Jilei Hou, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/336,250

(22) PCT Filed: Jun. 22, 2017

(86) PCT No.: PCT/CN2017/089561
§ 371 (c)(1),
(2) Date: Mar. 25, 2019

(87) PCT Pub. No.: WO2018/059023
PCT Pub. Date: Apr. 5, 2018

(65) Prior Publication Data
US 2019/0215105 A1    Jul. 11, 2019

(30) Foreign Application Priority Data

Sep. 27, 2016  (WO) ............... PCT/CN2016/100313

(51) Int. Cl.
*H04J 11/00* (2006.01)
*H04L 1/18* (2006.01)
(Continued)

(52) U.S. Cl.
CPC .......... *H04L 1/1819* (2013.01); *H03M 13/13* (2013.01); *H04B 17/336* (2015.01); *H04L 1/00* (2013.01);
(Continued)

(58) Field of Classification Search
CPC ... H04L 1/0001; H04L 1/0013; H04L 1/0057; H04L 1/0078
(Continued)

(56) References Cited

U.S. PATENT DOCUMENTS 7,954,041 B2 *  5/2011  Hong ................. H03M 13/1102
                                                      714/758
8,151,157 B2 *  4/2012  Lee ...................... H03M 13/116
                                                      714/749
(Continued)

FOREIGN PATENT DOCUMENTS

CN    101741527 A    6/2010
CN    101877629 A    11/2010
(Continued)

OTHER PUBLICATIONS

Niu, Polar codes, IEEE, Jul. 2014, pp. 192-203 (Year: 2014).*
(Continued)

*Primary Examiner* — Dmitry Levitan

(57) ABSTRACT

Various aspects of the disclosure relate to retransmission techniques for communication of information (e.g., for wireless communication). In some aspects, if a device's first transmission including encoded data and parity information (subject to puncture) fails, the device's retransmission (e.g., in response to a NAK) involves transmitting the parity information that was punctured. In some aspects, the coding rate used for encoding the data for the first transmission is selected to meet an error rate (e.g., a block error rate) for the second transmission. The second transmission may also
(Continued)

include repetition information that includes the encoded data. The repetition information could also include at least a portion of the encoded parity information.

22 Claims, 24 Drawing Sheets

(51) Int. Cl.
    *H04L 1/00*         (2006.01)
    *H04B 17/336*    (2015.01)
    *H03M 13/13*     (2006.01)

(52) U.S. Cl.
    CPC .......... *H04L 1/0063* (2013.01); *H04L 1/0068* (2013.01)

(58) Field of Classification Search
    USPC .................................. 370/203, 310, 315, 465
    See application file for complete search history.

(56) References Cited

U.S. PATENT DOCUMENTS

| | | | | |
|---|---|---|---|---|
| 8,171,374 | B2* | 5/2012 | Miyazaki | H03M 13/116 |
| | | | | 714/752 |
| 9,362,956 | B2* | 6/2016 | Mahdavifar | H03M 13/2707 |
| 9,923,665 | B2* | 3/2018 | Callard | H04L 1/1848 |
| 10,461,779 | B2* | 10/2019 | Hong | H04L 1/0067 |
| 2002/0015419 | A1 | 2/2002 | Kim et al. | |
| 2005/0022097 | A1* | 1/2005 | Cheng | H04L 1/1816 |
| | | | | 714/774 |
| 2005/0149841 | A1* | 7/2005 | Kyung | H04L 1/0003 |
| | | | | 714/800 |
| 2013/0039270 | A1 | 2/2013 | Strinati et al. | |
| 2013/0242914 | A1 | 9/2013 | Terry et al. | |
| 2015/0236715 | A1 | 8/2015 | Alhussien et al. | |
| 2016/0182187 | A1 | 6/2016 | Kim et al. | |
| 2019/0190654 | A1* | 6/2019 | You | H04L 5/0005 |
| 2019/0215105 | A1* | 7/2019 | Xu | H04L 1/0063 |

FOREIGN PATENT DOCUMENTS

| | | |
|---|---|---|
| CN | 103138880 A | 6/2013 |
| CN | 103475379 A | 12/2013 |
| EP | 3113398 A1 | 1/2017 |
| WO | 2015139248 A1 | 9/2015 |

OTHER PUBLICATIONS

International Search Report and Written Opinion—PCT/CN2016/100313—ISA/EPO—dated Jun. 28, 2017.
International Search Report and Written Opinion—PCT/CN2017/089561—ISA/EPO—dated Sep. 5, 2017.
QUALCOMM Incorporated: "Polar HARQ", 3GPP TSG-RAN WG 1 #86, R1-166371, Aug. 26, 2016, 9 pages.
Supplementary European Search Report—EP17854477—Search Authority—The Hague—dated Apr. 29, 2020.

* cited by examiner

RETRANSMISSION TECHNIQUES FOR ENCODED TRANSMISSIONS

CROSS-REFERENCE TO RELATED APPLICATION(S)

This application is the U.S. national stage of PCT patent application number PCT/CN2017/089561 filed on Jun. 22, 2017, which claims priority to and the benefit of PCT patent application number PCT/CN2016/100313 filed on Sep. 27, 2016, the content of each of which is incorporated herein by reference.

INTRODUCTION

Various aspects described herein relate to communication, and more particularly but not exclusively, to retransmission techniques for encoded transmissions.

A wireless communication system may use error correcting codes to facilitate reliable transmission of digital messages over noisy channels. A block code is one type of error correcting code. In a typical block code, an information message or sequence is split up into blocks, and an encoder at the transmitting device mathematically adds redundancy to the information message. Exploitation of this redundancy in the encoded information message improves the reliability of the message, enabling correction for bit errors that may occur due to the noise. That is, a decoder at the receiving device can take advantage of the redundancy to reliably recover the information message even though bit errors may occur, in part, due to the addition of noise by the channel. Examples of error correcting block codes include Hamming codes, Bose-Chaudhuri-Hocquenghem (BCH) codes, and turbo codes among others. Many existing wireless communication networks utilize such block codes, such as 3GPP LTE networks, which utilize turbo codes, and IEEE 802.11n Wi-Fi networks.

To further improve communication performance (e.g., in wireless communication systems), a retransmission scheme such a hybrid automatic repeat request (HARQ) scheme may be used. In a HARQ scheme, coded blocks are retransmitted if the first transmission is not decoded correctly. In some cases, several retransmissions may be needed to achieve a desired level of communication performance Given the delay associated with multiple retransmissions, however, a HARQ scheme might not provide sufficiently robust performance for systems that have very strict latency and/or reliability requirements. Accordingly, there is a need for error correction techniques that can provide a high level of performance (e.g., for low latency applications and other robust applications).

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

In one aspect, the disclosure provides an apparatus configured for communication that includes a memory and a processor coupled to the memory. The processor and the memory are configured to: encode first data to generate encoded data and encoded parity information; transmit first information including the encoded data and a portion of the encoded parity information; determine that a retransmission is needed; and transmit second information including the encoded parity information as a result of the determination that a retransmission is needed.

Another aspect of the disclosure provides a method for communication including: encoding first data to generate encoded data and encoded parity information; transmitting first information including the encoded data and a portion of the encoded parity information; determining that a retransmission is needed; and transmitting second information including the encoded parity information as a result of the determination that a retransmission is needed.

Another aspect of the disclosure provides an apparatus configured for communication. The apparatus including: means for encoding first data to generate encoded data and encoded parity information; means for transmitting configured to transmit first information including the encoded data and a portion of the encoded parity information; and means for determining that a retransmission is needed, wherein the means for transmitting is further configured to transmit second information including the encoded parity information as a result of the determination that a retransmission is needed.

Another aspect of the disclosure provides a non-transitory computer-readable medium storing computer-executable code, including code to: encode first data to generate encoded data and encoded parity information; transmit first information including the encoded data and a portion of the encoded parity information; determine that a retransmission is needed; and transmit second information including the encoded parity information as a result of the determination that a retransmission is needed.

In one aspect, the disclosure provides an apparatus configured for communication that includes a memory and a processor coupled to the memory. The processor and the memory are configured to: receive first information including encoded data and encoded parity information; decode the first information; send an indication that a retransmission is needed based on the decoding; receive second information including additional encoded parity information after sending the indication; and decode the first information using the second information.

Another aspect of the disclosure provides a method for communication including: receiving first information including encoded data and encoded parity information; decoding the first information; sending an indication that a retransmission is needed based on the decoding; receiving second information including additional encoded parity information after sending the indication; and decoding the first information using the second information.

Another aspect of the disclosure provides an apparatus configured for communication. The apparatus including: means for receiving configured to receive first information including encoded data and encoded parity information; means for decoding configured to decode the first information; and means for sending an indication that a retransmission is needed based on the decoding, wherein the means for receiving is further configured to receive second information including additional encoded parity information after sending the indication, and the means for decoding is further configured to decode the first information using the second information.

Another aspect of the disclosure provides a non-transitory computer-readable medium storing computer-executable code, including code to: receive first information including encoded data and encoded parity information; decode the first information; send an indication that a retransmission is needed based on the decoding; receive second information including additional encoded parity information after sending the indication; and decode the first information using the second information.

These and other aspects of the disclosure will become more fully understood upon a review of the detailed description, which follows. Other aspects, features, and implementations of the disclosure will become apparent to those of ordinary skill in the art, upon reviewing the following description of specific implementations of the disclosure in conjunction with the accompanying figures. While features of the disclosure may be discussed relative to certain implementations and figures below, all implementations of the disclosure can include one or more of the advantageous features discussed herein. In other words, while one or more implementations may be discussed as having certain advantageous features, one or more of such features may also be used in accordance with the various implementations of the disclosure discussed herein. In similar fashion, while certain implementations may be discussed below as device, system, or method implementations it should be understood that such implementations can be implemented in various devices, systems, and methods.

BRIEF DESCRIPTION OF THE DRAWINGS

The accompanying drawings are presented to aid in the description of aspects of the disclosure and are provided solely for illustration of the aspects and not limitations thereof.

DETAILED DESCRIPTION

Figure 1:
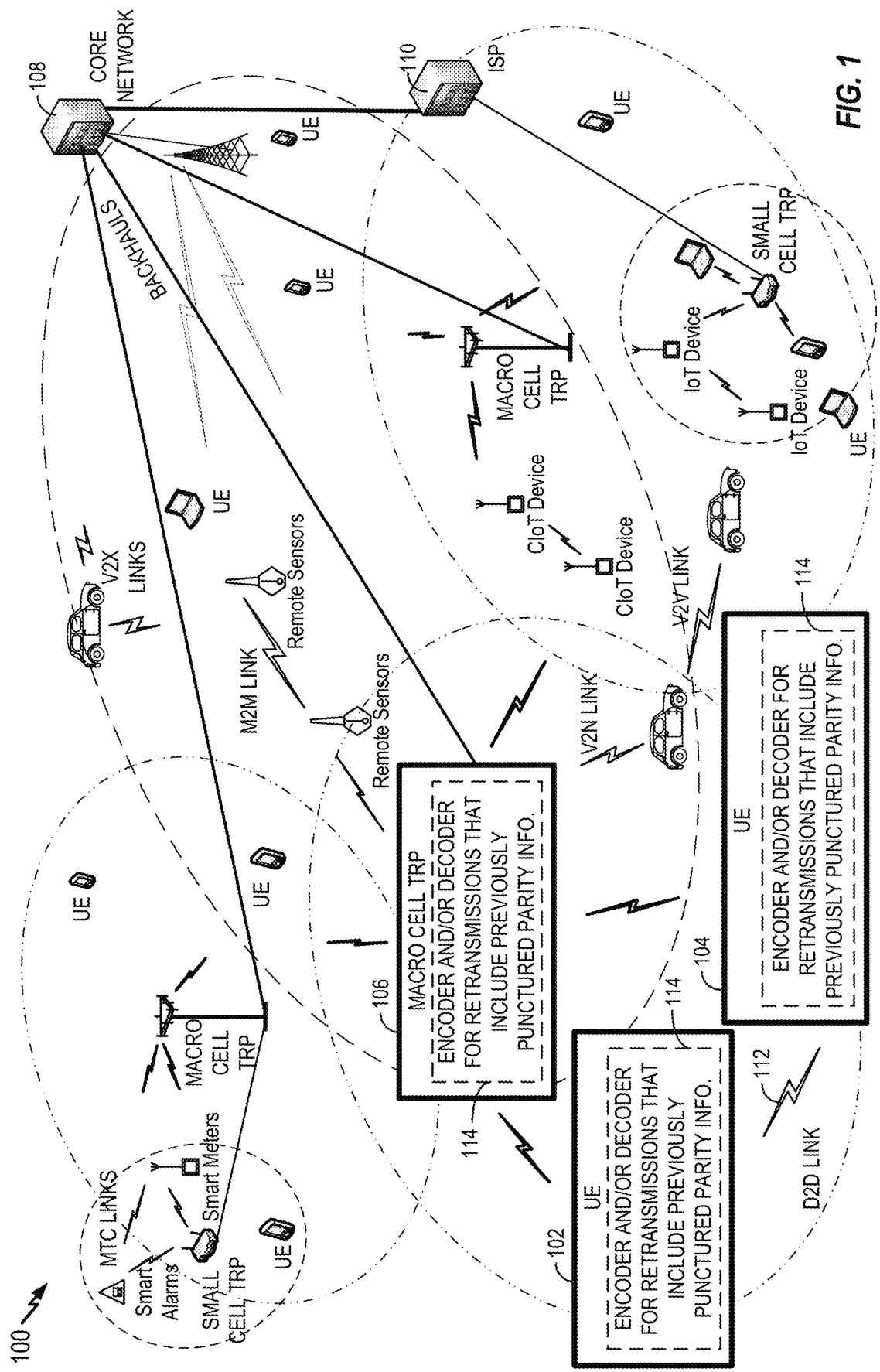
FIG. 1 is a block diagram of an example communication system in which aspects of the disclosure may be used.

Various aspects of the disclosure relate to retransmission of coded information. A first transmission by a device may include encoded data and encoded parity information (punctured to some degree). If the device's first transmission is not successfully received at a receiver, the device may conduct a retransmission (e.g., in response to a negative acknowledgement, NAK, from the receiver). In accordance with the teachings herein, the retransmission may include the encoded parity information that was punctured (e.g., in its entirety). In addition, the retransmission may include repetition information that includes at least a portion of the encoded data and/or at least a portion of the encoded parity information sent during the first transmission.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. Moreover, alternate configurations may be devised without departing from the scope of the disclosure. Additionally, well-known elements will not be described in detail or will be omitted so as not to obscure the relevant details of the disclosure.

The various concepts presented throughout this disclosure may be implemented across a broad variety of telecommunication systems, network architectures, and communication standards. For example, the 3rd Generation Partnership Project (3GPP) is a standards body that defines several wireless communication standards for networks involving the evolved packet system (EPS), frequently referred to as long-term evolution (LTE) networks. Evolved versions of the LTE network, such as a fifth-generation (5G) network, may provide for many different types of services or applications, including but not limited to web browsing, video streaming, VoIP, mission critical applications, multi-hop networks, remote operations with real-time feedback (e.g., tele-surgery), etc. Thus, the teachings herein can be implemented according to various network technologies including, without limitation, 5G technology, fourth generation (4G) technology, third generation (3G) technology, and other network architectures. Also, the techniques described herein may be used for a downlink, an uplink, a peer-to-peer link, or some other type of link.

The actual telecommunication standard, network architecture, and/or communication standard used will depend on the specific application and the overall design constraints imposed on the system. For purposes of illustration, the following may describe various aspects in the context of a 5G system and/or an LTE system. It should be appreciated, however, that the teachings herein may be used in other systems as well. Thus, references to functionality in the context of 5G and/or LTE terminology should be understood to be equally applicable to other types of technology, networks, components, signaling, and so on.

Example Communication System

FIG. 1 illustrates an example of a wireless communication system 100 where a user equipment (UE) can communicate with other devices via wireless communication signaling. For example, a first UE 102 and a second UE 104 may communicate with a transmit receive point (TRP) 106 using wireless communication resources managed by the TRP 106 and/or other network components (e.g., a core network 108, an internet service provider (ISP) 110, peer devices, and so on). In some implementations, one or more of the components of the system 100 may communicate with each other directedly via a device-to-device (D2D) link 112 or some other similar type of direct link.

Communication of information between two or more of the components of the system 100 may involve encoding the information. For example, the TRP 106 may encode data or control information that the TRP 106 sends to the UE 102 or the UE 104. As another example, the UE 102 may encode data or control information that the UE 102 sends to the TRP 106 or the UE 104. The encoding may involve block coding such as Polar coding. In accordance with the teachings herein, one or more of the UE 102, the UE 104, the TRP 106, or some other component of the system 100 may include an encoder and/or a decoder for retransmissions that include previously punctured parity information 114.

The components and links of the wireless communication system 100 may take different forms in different implementations. Examples of UEs may include, without limitation, cellular devices, Internet of Things (IoT) devices, cellular IoT (CIoT) devices, LTE wireless cellular devices, machine-type communication (MTC) cellular devices, smart alarms, remote sensors, smart phones, mobile phones, smart meters, personal digital assistants (PDAs), personal computers, mesh nodes, and tablet computers.

In some aspects, a TRP may refer to a physical entity that incorporates radio head functionality for a particular physical cell. In some aspects, the TRP may include 5G new radio (NR) functionality with an air interface based on orthogonal frequency division multiplexing (OFDM). NR may support, for example and without limitation, enhanced mobile broadband (eMBB), mission-critical services, and wide-scale deployment of IoT devices. The functionality of a TRP may be similar in one or more aspects to (or include or be incorporated into) the functionality of a CIoT base station (C-BS), a NodeB, an evolved NodeB (eNodeB), radio access network (RAN) access node, a radio network controller (RNC), a base station (BS), a radio base station (RBS), a base station controller (BSC), a base transceiver station (BTS), a transceiver function (TF), a radio transceiver, a radio router, a basic service set (BSS), an extended service set (ESS), a macro cell, a macro node, a Home eNB (HeNB), a femto cell, a femto node, a pico node, or some other suitable entity. In different scenarios (e.g., NR, LTE, etc.), a TRP may be referred to as a gNodeB (gNB), an eNB, a base station, or referenced using other terminology.

Figure 2:
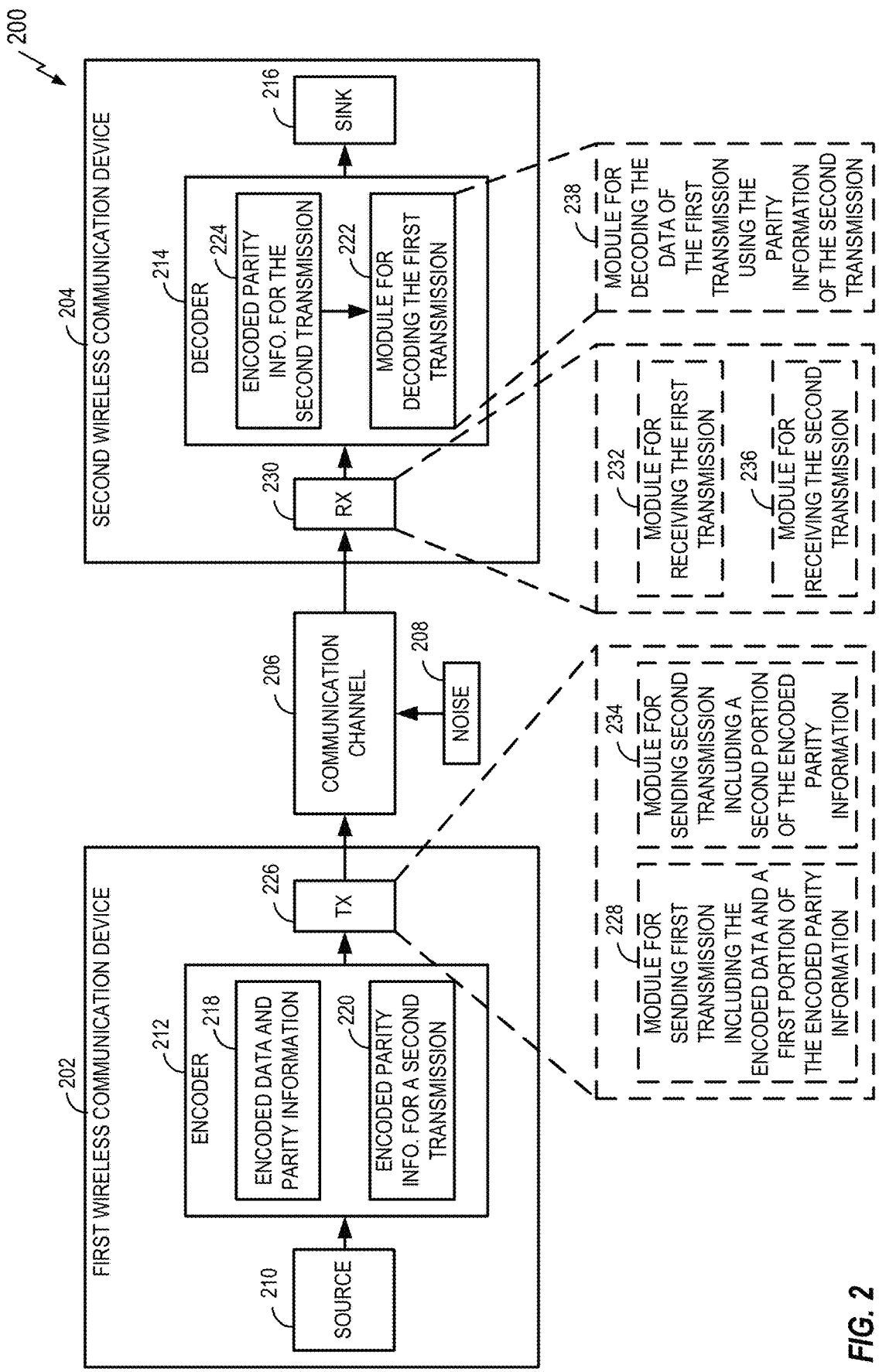
FIG. 2 is a block diagram of example communication devices in accordance with some aspects of the disclosure.

Various types of network-to-device links and D2D links may be supported in the wireless communication system 100. For example, D2D links may include, without limitation, machine-to-machine (M2M) links, MTC links, vehicle-to-vehicle (V2V) links, and vehicle-to-anything (V2X) links Network-to-device links may include, without limitation, uplinks (or reverse links), downlinks (or forward links), and vehicle-to-network (V2N) links Example Communication Components FIG. 2 illustrates a wireless communication system 200 that includes a first wireless communication device 202 and a second wireless communication device 204 that may use the teachings herein. In some implementations, the first wireless communication device 202 or the second wireless communication device 204 may correspond to the UE 102, the UE 104, the TRP 106, or some other component of FIG. 1.

In the illustrated example, the first wireless communication device 202 transmits a message over a communication channel 206 (e.g., a wireless channel) to the second wireless communication device 204. One issue in such a scheme that should be addressed to provide for reliable communication of the message, is to take into account noise 208 that affects the communication channel 206.

Block codes or error correcting codes are frequently used to provide reliable transmission of messages over noisy channels. In a typical block code, an information message or sequence from an information source 210 at the first (transmitting) wireless communication device 202 is split up into blocks, each block having a length of K bits. An encoder 212 mathematically adds redundancy to the information message, resulting in codewords having a length of N, where N>K. Here, the code rate R is the ratio between the message length and the block length (i.e., R=K/N). Exploitation of this redundancy in the encoded information message is a key to reliably receiving the transmitted message at the second (receiving) wireless communication device 204, whereby the redundancy enables correction for bit errors that may occur due to the noise 208 imparted on the transmitted message. That is, a decoder 214 at the second (receiving) wireless communication device 204 can take advantage of the redundancy to reliably recover the information message even though bit errors may occur, in part, due to the addition of the 208 noise to the channel 206. The decoder 214 provides the recovered information message to an appropriate information sink 216.

Many examples of such error correcting block codes are known to those of ordinary skill in the art, including Hamming codes, Bose-Chaudhuri-Hocquenghem (BCH) codes, and turbo codes, among others. Some existing wireless communication networks utilize such block codes. For example, 3GPP LTE networks may use turbo codes. However, for future networks, a new category of block codes, called Polar codes, presents a potential opportunity for reliable and efficient information transfer with improved performance relative to other codes.

The disclosure relates in some aspects to the use of hybrid automatic repeat request (HARQ) with Polar codes (described below). For example, the encoder 212 may encode information bits from the information source 210 to generate encoded data and parity information 218. A transmit controller (TX) 226 of the first wireless communication device 202 includes a module for sending a first transmission including the encoded data and a first portion of the encoded parity information 228 (e.g., a portion of the parity information that was not punctured) to the second wireless communication device 204. In addition, the encoder 212 stores encoded parity information for a second transmission 220 (e.g., a punctured portion of the encoded parity information that is not sent during the first transmission) in case a retransmission is needed.

A receive controller (RX) 230 of the second wireless communication device 204 includes a module for receiving the first transmission 232. The decoder 214 includes a module for decoding the first transmission 222 (e.g., a successive cancellation (SC) decoder implemented in accordance with the teachings herein). If the decoder 214 is not able to correctly decode the received encoded data and parity of the first transmission, the second wireless communication device 204 may send NAK feedback (not shown) to the first wireless communication device 202.

In response to NAK feedback, the first wireless communication device 202 may send a second transmission (which may be referred to as a retransmission) via a module for sending a second transmission including a second portion of the encoded parity information 234 (e.g., including the punctured parity information that was not sent in the first transmission) to the second wireless communication device 204. In some cases, the second transmission may also include repetition information. The repetition information may include, for example, a repetition of the encoded data (e.g., at least a portion of the systematic bits of the encoded data) and/or the parity information that was sent in the first transmission. Thus, as discussed in more detail below, a retransmission (e.g., a final transmission) may involve sending the encoded parity information for a second transmission 220 discussed above, optionally with repetition information.

The receive controller (RX) 230 includes a module for receiving the second transmission 236, and thereby receive the encoded parity information for the second transmission 224. In accordance with the teachings herein, the module for decoding the first transmission 222 may use the encoded parity information for the second transmission 224 to decode the received data. As mentioned above, this parity information includes parity information that was not sent (e.g., was punctured) in the first transmission. To this end, the module for decoding the first transmission 222 includes a module for decoding the data of the first transmission using the parity information of the second transmission 238.

In addition, the module for decoding the first transmission 222 may use repetition information included in the second transmission to decode the received data. As mentioned above, the repetition information may include, for example, at least a portion of the encoded data and, optionally, at least a portion of the encoded parity information from the first transmission. Thus, the module for decoding the first transmission 222 may use the repetion information to perform soft combining of the encoded data and/or parity of the first transmission with the encoded data and/or parity of the second transmission.

As discussed in more detail below, in some aspects, the disclosed HARQ scheme may be effective for ultra-reliability low latency communication (URLLC). A URLLC application may be used, for example, in a 5G system or some other type of communication system. URLLC may be used to support applications such as smart grid, industrial automation, augmented reality, and other high-performance applications. In some aspects, a URLLC application may have very strict performance requirements. For example, a block error rate (BLER) on the order of 1E-5 or even lower may be specified. In addition, latency on the order of 1 millisecond (ms) or lower may be specified.

Figure 3:
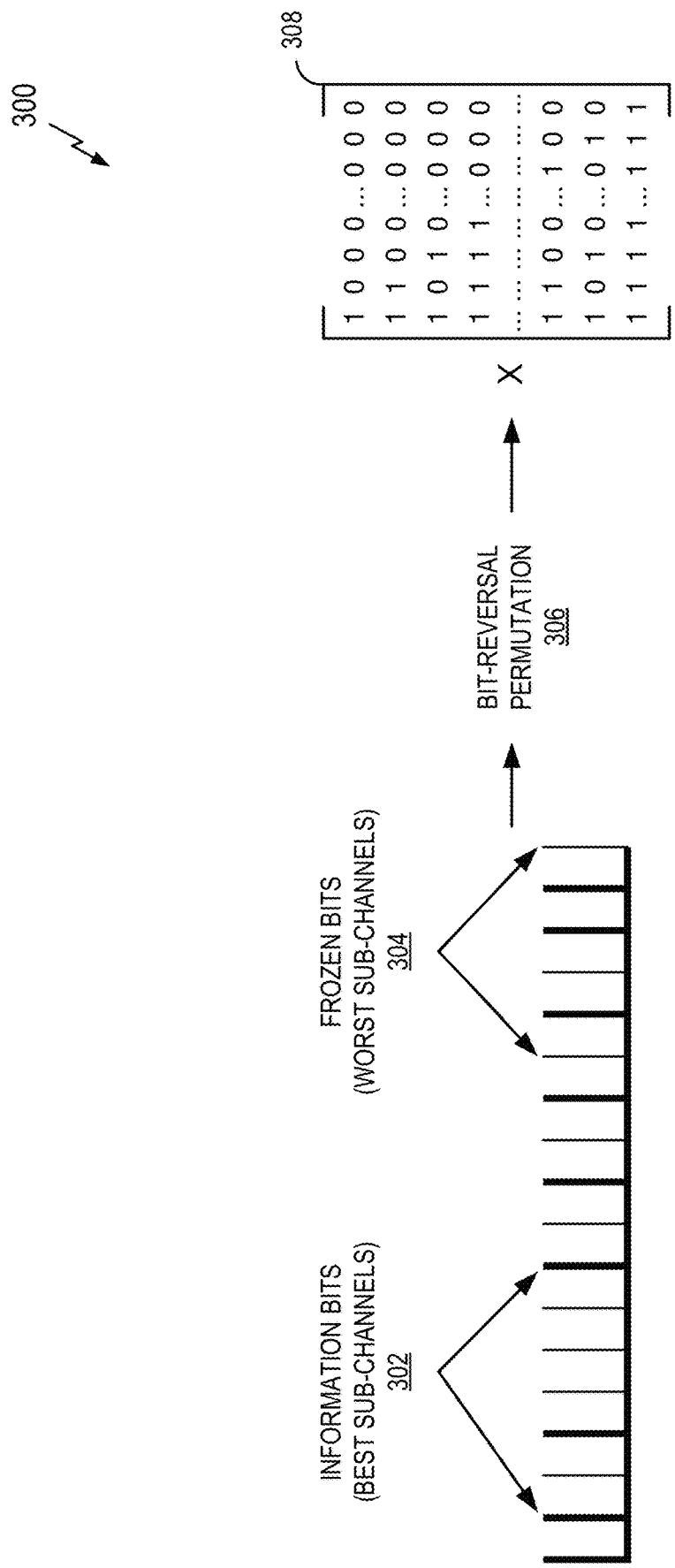
FIG. 3 is a conceptual diagram illustrating an example of encoding based on Polar codes.
Figure 4:
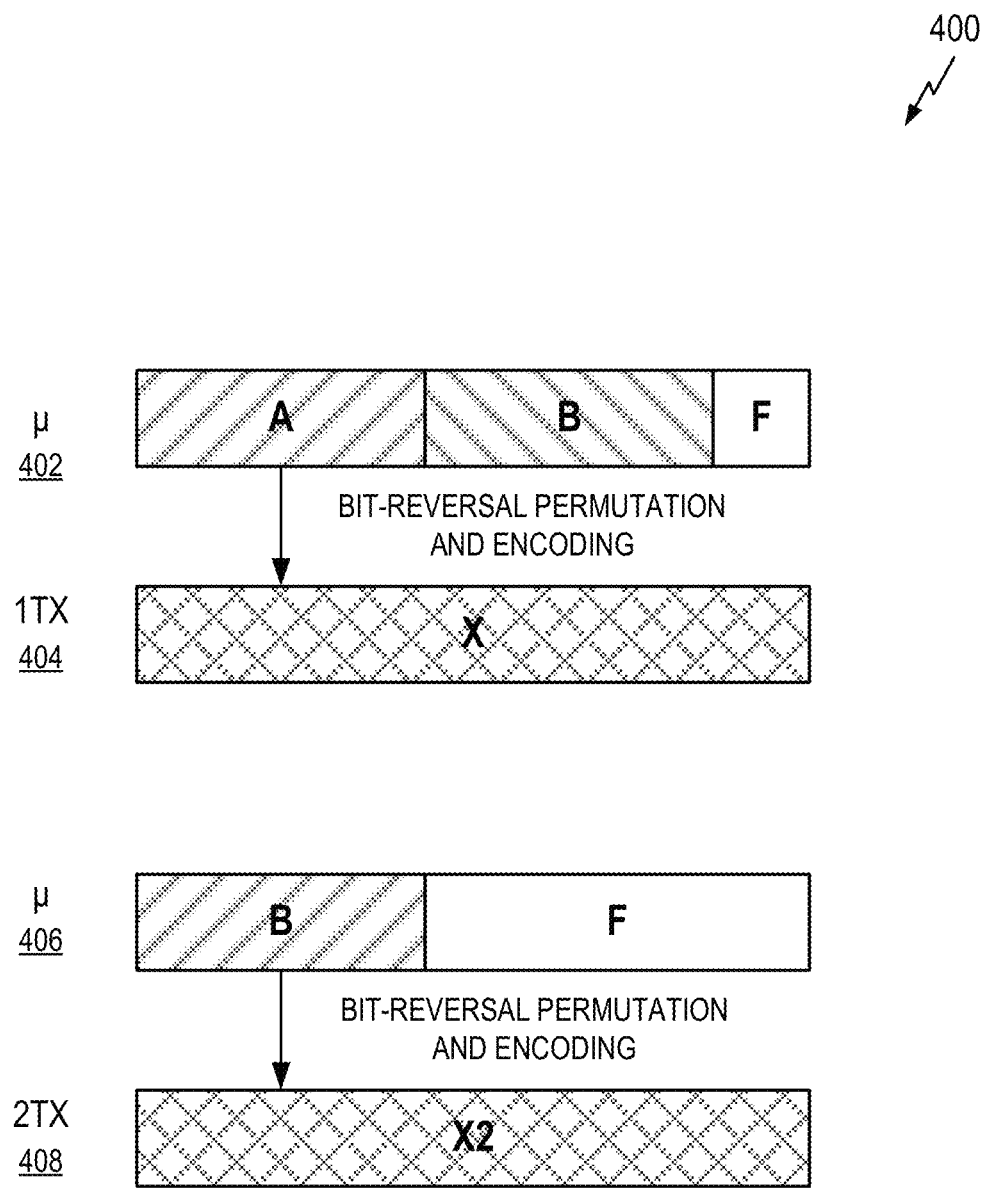
FIG. 4 is a diagram of an example hybrid automatic repeat request (HARQ) scheme for Polar codes.

Turning now to FIGS. 3 and 4, several aspects of Polar codes and HARQ schemes will be described in more detail. It should be appreciated that these examples are presented for purposes of explanation and that the teachings herein may be applicable to other types of coding and retransmission schemes.

Polar Codes

Polar codes are linear block error correcting codes where channel polarization is generated with a recursive algorithm that defines polar codes. Polar codes are the first explicit codes that achieve the channel capacity of symmetric binary-input discrete memoryless channels. That is, polar codes achieve the channel capacity (the Shannon limit) or the theoretical upper bound on the amount of error-free information that can be transmitted on a discrete memoryless channel of a given bandwidth in the presence of noise. This capacity can be achieved with a simple successive cancellation (SC) decoder.

A typical encoder structure 300 of Polar codes is depicted in FIG. 3. Polar code sub-channels are allocated into two subsets, best sub-channels and worst sub-channels, based on the corresponding error probability associated with each sub-channel. The information bits 302 are then put on the best sub-channels while frozen bits 304 (with zero values) are put on the worst sub-channels. A bit-reversal permutation 306 is used to provide the output bits of the decoder in a desired sequence. The encoding is performed after multiplying by a Hadamard matrix 308. The generator matrices of Polar codes are made up of the rows of a Hadamard matrix. The rows corresponding to low error probabilities of an SC decoder are selected for information bits while the remaining rows are for frozen bits.

It may thus be seen that the Polar codes are one type of block codes (N, K), where N is the codeword length and K is the number of information bits. With polar codes, the codeword length N is a power-of-two (e.g., 256, 512, 1024, etc.) because the original construction of a polarizing matrix is based on the Kronecker product of $$\begin{bmatrix} 1 & 0 \\ 1 & 1 \end{bmatrix}.$$

HARQ

HARQ incremental redundancy (HARQ-IR) schemes are widely used in wireless communication systems to improve transmission efficiency. In a HARQ-IR scheme, the coded blocks will be retransmitted if the first transmission is not decoded correctly. The maximum number of transmissions in a typical application is 4. However, some applications may use a different retransmission limit.

An example of a HARQ-IR scheme 400 for Polar codes is depicted in FIG. 4. For simplification, only a first transmission and a second transmission (a retransmission) are shown. In the μ domain 402 of the first transmission, the information bits are allocated into two sub-blocks denoted as A and B. The F block is for frozen bits with a value of zero. After bit-reversal permutation and encoding, a coded block in the X domain is obtained. If the first transmission (1TX) 404 of this block is decoded correctly at the receiver, the transmission ends.

However, if the first transmission (1TX) 404 is not decoded correctly, the transmitter will generate a new codeword in the ti domain 406 with B information bits. After bit-reversal permutation and encoding, the transmitter invokes a second transmission (2TX) 408 to send a corresponding coded block in the X2 domain. If the receiver does not decode the B information for the second transmission (2TX) 408 correctly, a third transmission may be invoked, and so on.

If the B information in the second transmission (2TX) 408 is decoded correctly by the receiver, the B information in first transmission will be set as frozen bits and the A information in first transmission will be decoded accordingly. In this case, this is equivalent to obtaining the low rate for the A information in the first transmission.

From a performance standpoint, the algorithm of FIG. 4 may thus be equivalent to existing (e.g., non-Polar coding) HARQ-IR schemes in terms of coding gain. In FIG. 4, the equivalent coding rate after two transmissions is half of the first transmission with a block size of the first transmission. As such, the performance may be worse than the performance would be using half-rate coding with double the block size of the first transmission. Moreover, the algorithm of FIG. 4 involves two separate coding processes: one for the first transmission and another one for the second transmission.

In view of the above, existing algorithms may be difficult to apply in URLLC. In a URLLC system, the maximum number of transmissions may be relatively low to meet low latency requirements. For example, the maximum number of transmissions may be limited to 2 (or some other number), with the requirement that the desired block error rate (BLER) still be met with this small number of transmissions. Existing schemes might not be able to meet the desired BLER within the maximum allowed number of transmissions. Consequently, existing HARQ schemes might not be efficient enough for URLLC given the ultra-reliability and low latency requirements in URLLC applications.

Low Latency and Ultra-Reliability HARQ for Polar Codes

The disclosure relates in some aspects to an HARQ scheme for Polar codes that has better performance than existing coding schemes. In some aspects, the disclosed scheme may provide ultra-reliability and low latency (e.g., sufficient for URLLC applications).

An example of a design rule for HARQ of Polar codes in accordance with the teachings herein follows. First, the target BLER of the final transmission may be guaranteed. Second, a suitable coding rate for the first transmission may be selected to increase efficiency. Third, more resources may be allocated for the final transmission to provide an ultra-low residual BLER.

Example Encoding Operation

Figure 5:
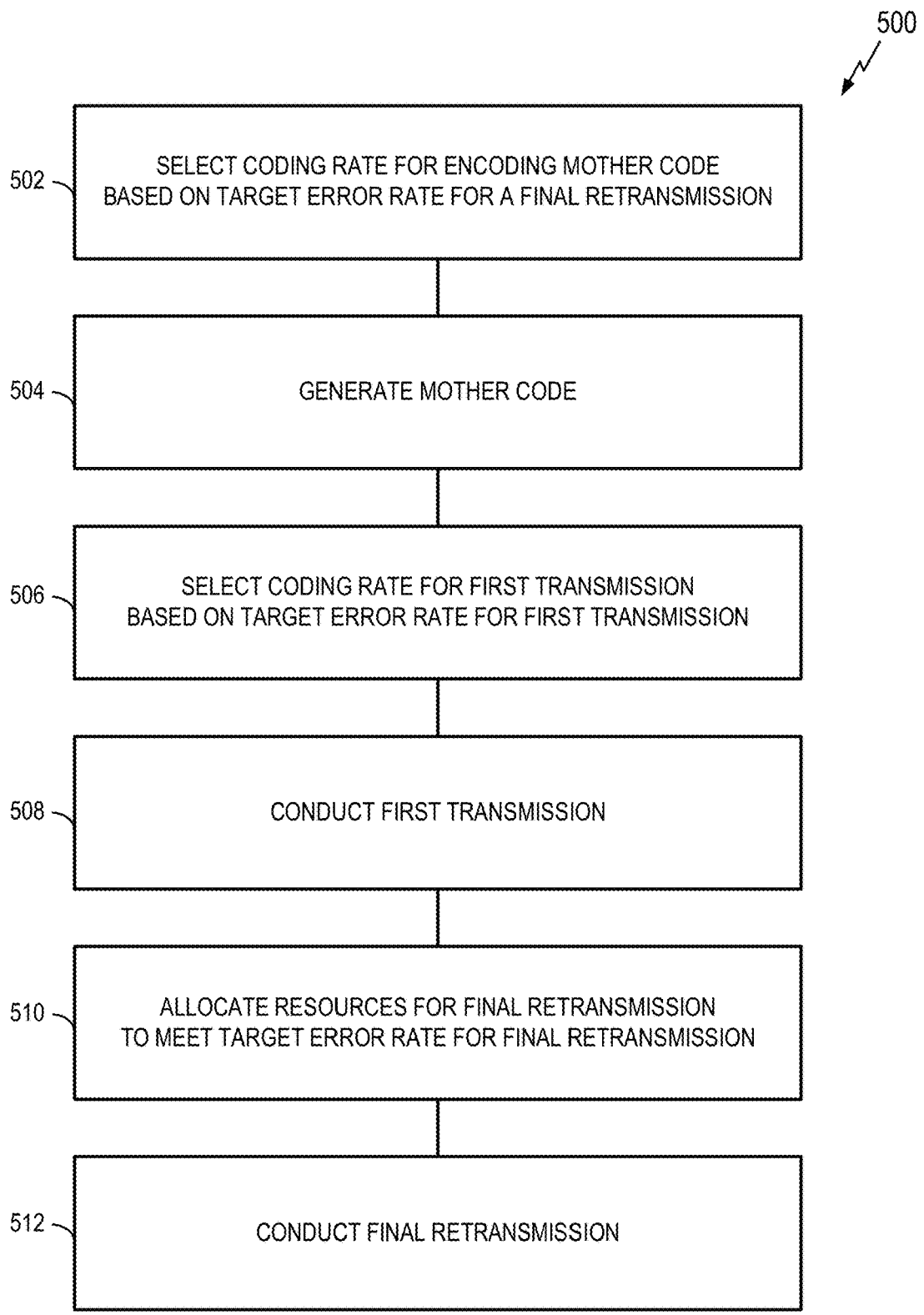
FIG. 5 is a flowchart illustrating an example of an encoding process in accordance with some aspects of the disclosure.

FIG. 5 illustrates an example process 500 for encoding data in accordance with the above design rule. The process 500 may take place within a processing circuit (e.g., the processing circuit 1110 of FIG. 11), which may be located in a UE, a TRP, an access terminal, a base station, or some other suitable apparatus (e.g., that provides encoding). Of course, in various aspects within the scope of the disclosure, the process 500 may be implemented by any suitable apparatus capable of supporting communication-related operations.

At block 502, an apparatus (e.g., a device that includes an encoder) selects a coding rate for encoding a mother code. In some aspects, this coding rate may be selected based on a target error rate for a final retransmission.

At block 504, the apparatus generates the mother code. For example, the apparatus may encode input data according to the coding rate selected at block 502. As discussed herein, this encoding may be Polar coding.

At block 506, the apparatus selects a coding rate for a first transmission of the encoded input data. In some aspects, this coding rate may be selected based on a target error rate (e.g., a BLER) for the first transmission. For example, the mother code may be punctured according to the coding rate to generate a block of data to be transmitted.

At block 508, the apparatus conducts the first transmission. For example, the apparatus may send the encoded block of data to a receiving apparatus via a wired or wireless communication medium.

As discussed herein, in some cases, a retransmission may occur. For example, the apparatus may receive an indication (e.g., a NAK) that the receiving apparatus was not able to successfully decode the first transmission. One or more retransmissions may be allowed depending on application requirements.

At block 510, the apparatus allocates resources for the final retransmission to meet the target error rate (e.g., BLER) for the last retransmission.

At block 512, the apparatus conducts the final retransmission using the resources allocated at block 510.

In some aspects, the process 500 may include any combination of two or more of the above features.

Example HARQ Structure

Figure 6:
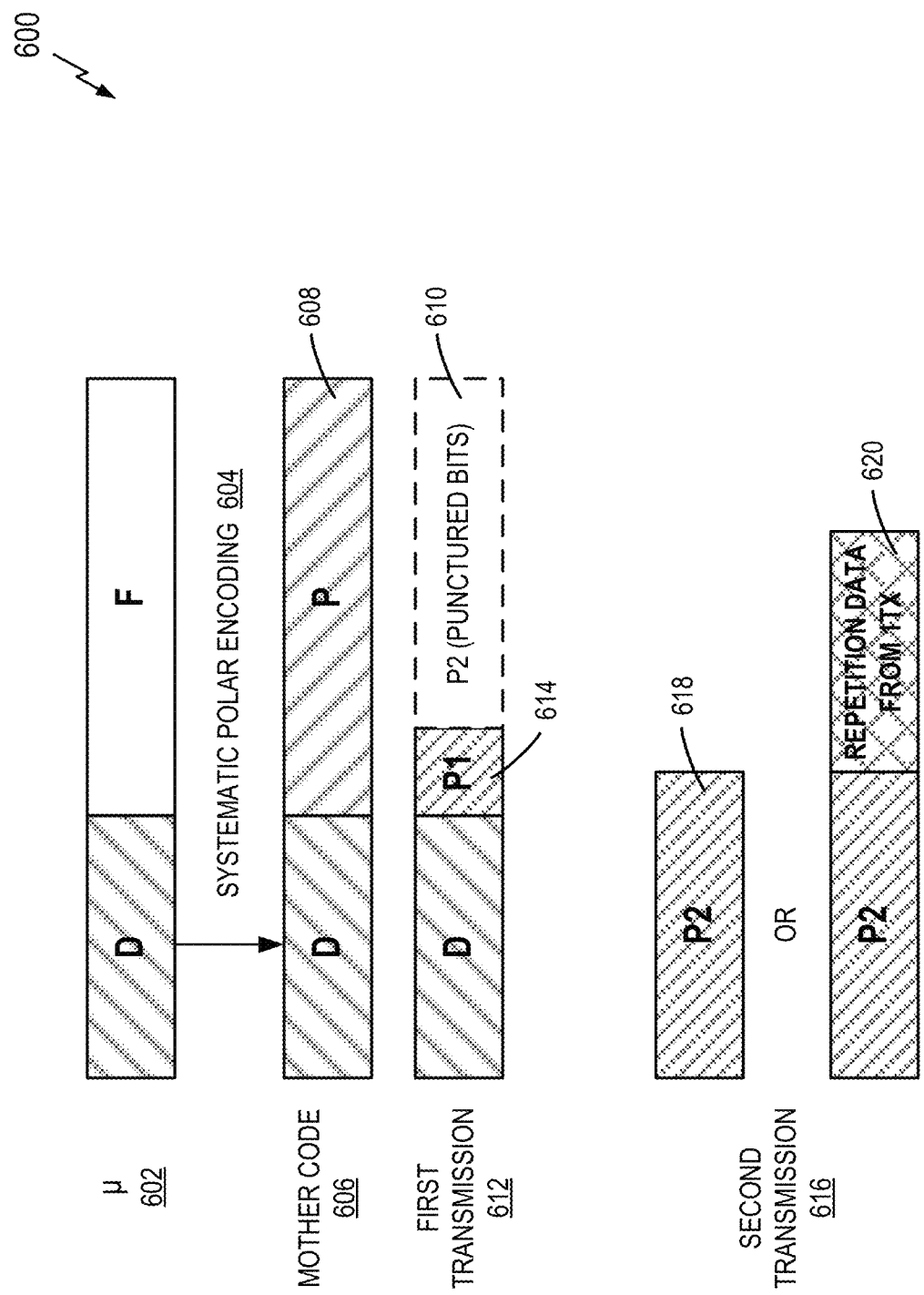
FIG. 6 is a diagram of an example structure of a HARQ scheme for Polar codes in accordance with some aspects of the disclosure.

FIG. 6 depicts an example structure 600 of a HARQ Scheme for Polar Codes with low latency and ultra-reliability in accordance with the teachings herein. In the μ domain 602, the information bits are denoted as D and the frozen bits with a value of zero are denoted as F. Thus, the block D in FIG. 6 generally corresponds to the A and B blocks of FIG. 4. Systematic Polar encoding 604 of these bits creates a so-called mother code 606 that includes a block denoted as D (encoded data) and a block denoted as block P 608 (encoded parity check bits). Thus, the mother code 606 is a systematic Polar code in this example. Based on the selected coding rate, some of the bits of the mother code 606 are punctured. The block P2 610 represents the punctured bits for the first transmission 612. The block P1 614 represents the parity check bits included in the first transmission 612. The block P1 614 is from the block P 608 (generally with a change in bit locations).

If the receiver does not successfully decode the first transmission 612, a second transmission 616 (a retransmission) is invoked. In some aspects, the second transmission 608 may involve transmission of a block P2 618 (corresponding to the block P2 610) or the block P2 together with repetition bits 620 from the first transmission 612. The coded bits for the first transmission 612 and the second transmission 616 may be generated as described in the sections that follow.

Multiple Retransmissions

Figure 7:
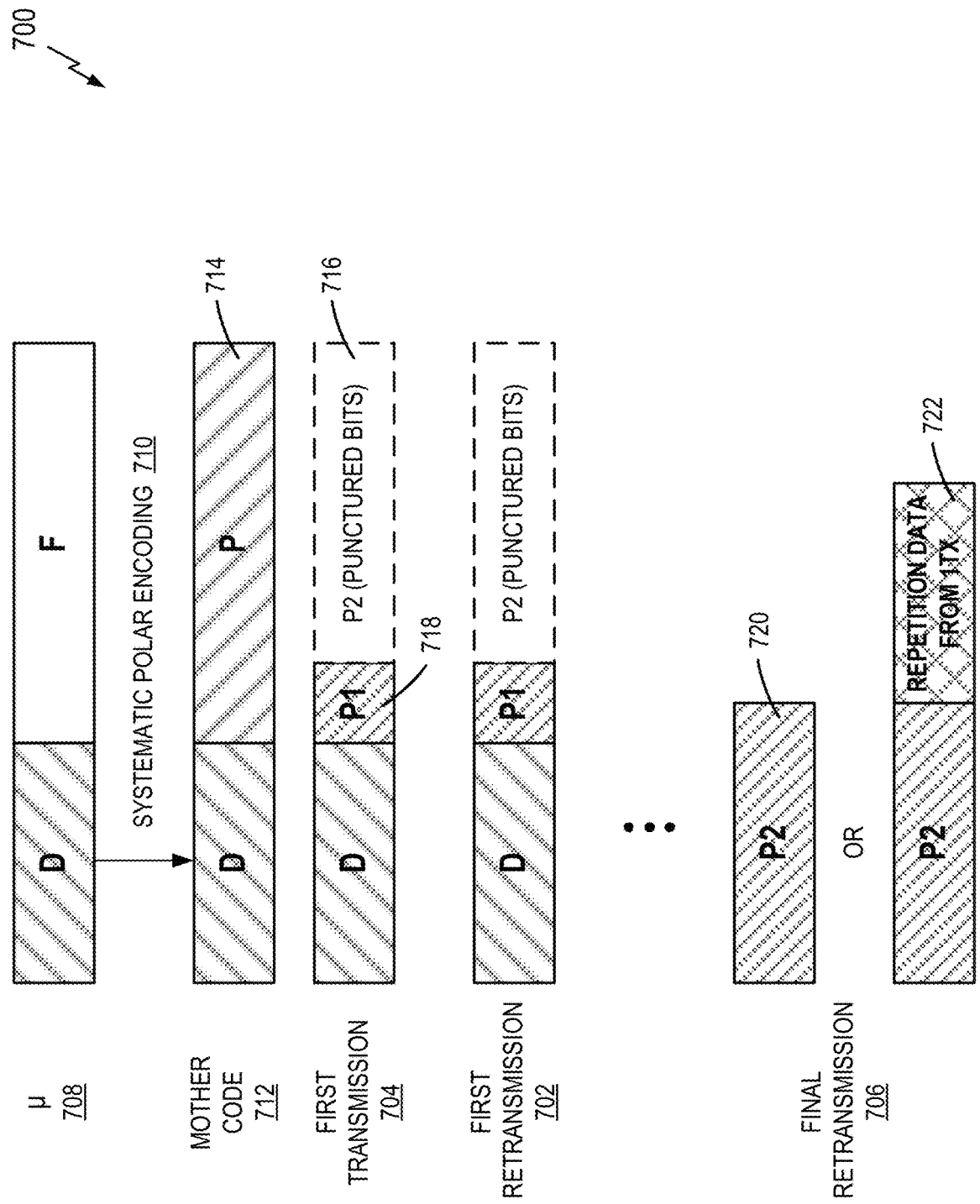
FIG. 7 is a diagram of an example structure of a HARQ scheme for Polar codes with multiple retransmissions in accordance with some aspects of the disclosure.

FIG. 7 illustrates an example HARQ structure 700 where there is more than one retransmission. As shown in this example, a first retransmission 702 may include the same information as a first transmission 704. In other implementations, the first retransmission 702 or any other intermediate retransmission (i.e., any retransmission before a final retransmission 706) may be optimized in some other way.

Similar to FIG. 6, in the HARQ structure 700, information bits in the ti domain 708 are denoted as D and the frozen bits with a value of zero are denoted as F. Systematic Polar encoding 710 of these bits creates a mother code 712 that includes a block denoted as D (encoded data) and a block denoted as block P 714 (encoded parity check bits). The block P2 716 represents the punctured bits for the first transmission 704. The block P1 718 represents the parity check bits included in the first transmission 704. If the receiver does not successfully decode the first transmission 704, the first retransmission 702 is invoked. The number of retransmissions before the last retransmission 706 depends on the system configuration. As shown, the last transmission 706 may involve transmission of the block P2 720 (corresponding to the block P2 716) or the block P2 together with repetition bits 722 from the first transmission 704.

The number of retransmissions that are used in a given scenario may be based on operating requirements. In some aspects, the maximum number of transmissions may be limited by the frame structure. For example, in a time division duplex (TDD) system, a fixed amount of time is allocated for transmission in one direction (e.g., uplink) before a turn-around (e.g., to downlink) is required. Thus, in some cases, all retransmissions may need to complete before the turn-around occurs. Thus, a retransmission time budget can depend on the frame structure in some cases. Alternatively, or in addition, the retransmission time budget may be based on some other factor or other factors.

Figure 8:
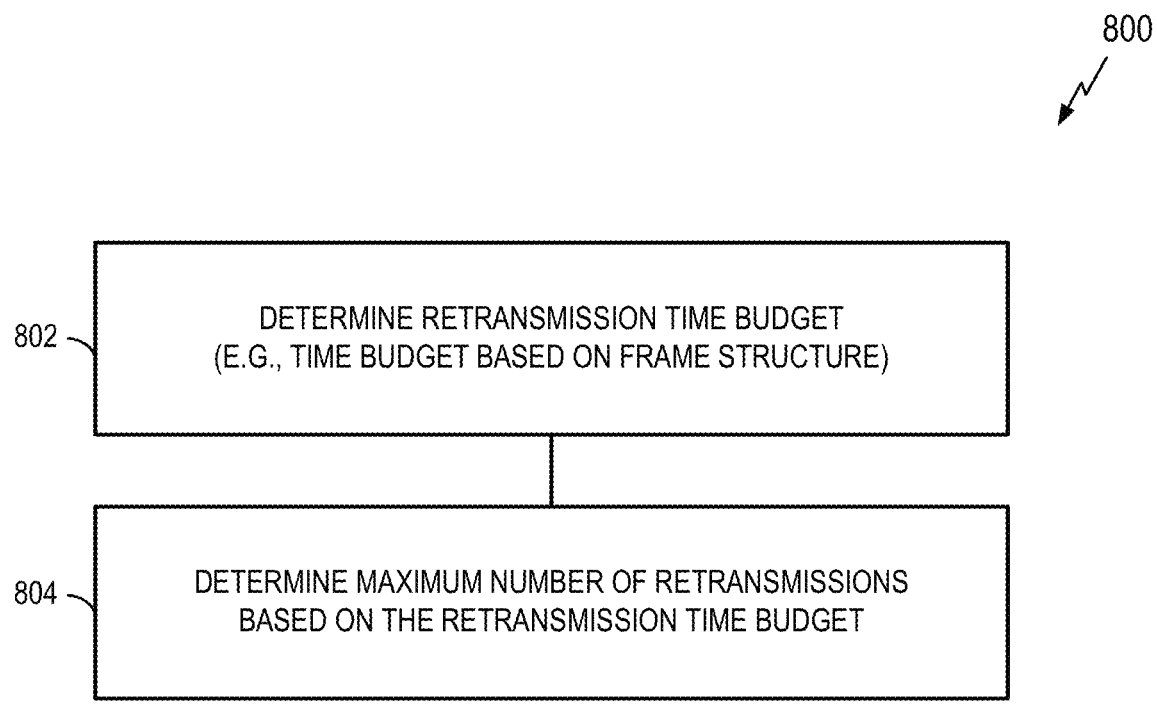
FIG. 8 is a flowchart illustrating an example of a process for determining a maximum number of retransmissions in accordance with some aspects of the disclosure.

FIG. 8 illustrates a process 800 for determining a maximum number of retransmissions in accordance with some aspects of the disclosure. The process 800 may take place within a processing circuit (e.g., the processing circuit 1110 of FIG. 11), which may be located in a UE, a TRP, an access terminal, a base station, or some other suitable apparatus (e.g., that provides encoding). Of course, in various aspects within the scope of the disclosure, the process 800 may be implemented by any suitable apparatus capable of supporting communication-related operations.

At block 802, an apparatus (e.g., a device that includes an encoder) determines a retransmission time budget. For example, this budget may be based on the frame structure or some other factor.

At block 804, the apparatus determines a maximum number of retransmissions based on the time budget. For example, if the retransmission time budget is 1 ms, and retransmission takes 400 microseconds, the maximum number of retransmissions is two.

In some aspects, the process 800 may include any combination of two or more of the above features.

Generating the Mother Code

The number of the information bits of the mother code is obtained according to the transport block size. Thus, the size of the mother code may depend on a size of a protocol data unit (PDU) specified by an upper layer. In some aspects, the upper layer may set the transport block size based on the type of data being transmitted, system requirements, or other factors.

In general, the transport block size in URLLC may be relatively small. Therefore, in this case, the transport block can be encoded into one code block to avoid high latency.

In view of the above, in some aspects, the size of D in FIGS. 6 and 7 may depend on the transport block size. In one non-exclusive example, the block size for the first transmission 612 of FIG. 6 is the same as the block size of FIG. 4 (e.g., with D being the same as well). Thus, the block size for the mother code 606 of FIG. 6 is larger than the block size of FIG. 4, thereby enabling better performance.

The modulation order and coding rate for generating the mother code may be selected to achieve the target BLER for the second transmission according to a long-term signal-to-noise ratio (SNR). The long-term SNR may be obtained, for example, by averaging the SNR of data received via a channel over a period of time.

Figure 9:
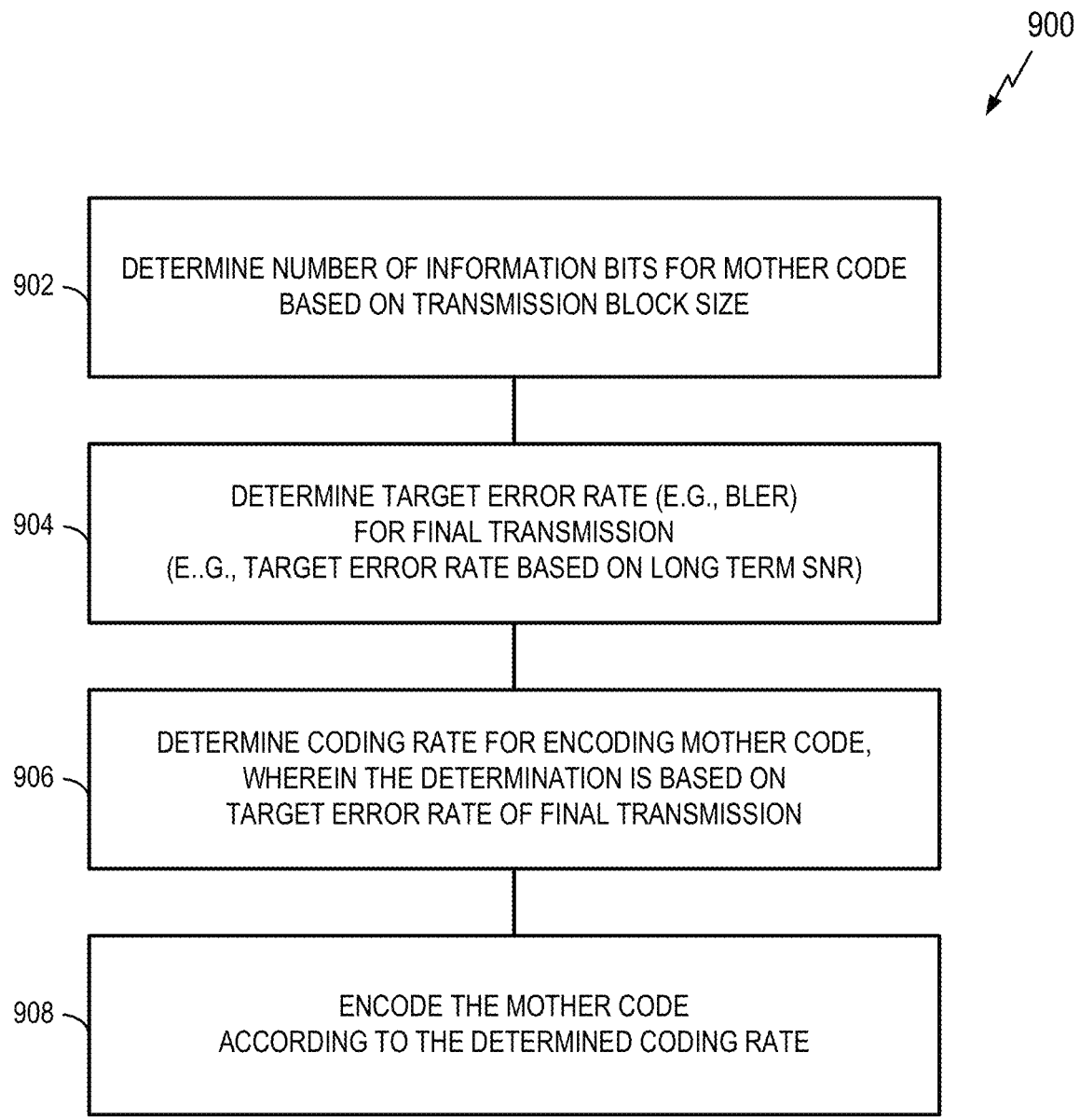
FIG. 9 is a flowchart illustrating an example of a process for generating a mother code in accordance with some aspects of the disclosure.

FIG. 9 illustrates a process 900 for generating a mother code in accordance with some aspects of the disclosure. The process 900 may take place within a processing circuit (e.g., the processing circuit 1110 of FIG. 11), which may be located in a UE, a TRP, an access terminal, a base station, or some other suitable apparatus (e.g., that provides encoding). Of course, in various aspects within the scope of the disclosure, the process 900 may be implemented by any suitable apparatus capable of supporting communication-related operations.

At block 902, an apparatus (e.g., a device that includes an encoder) determines the number of information bits for the mother code based on the transmission block size.

At block 904, the apparatus determines the target error rate (e.g., BLER) for the final transmission. As mentioned above, the target error rate may be based on the long-term SNR.

At block 906, the apparatus determines the coding rate for encoding the mother code based on the target error rate determined at block 904.

At block 908, the apparatus encodes the mother code according to the coding rate of block 906. As discussed herein, systematic Polar codes may be used to provide better performance.

In some aspects, the process 900 may include any combination of two or more of the above features.

Generating Code for the First Transmission

The number of the information bits of the first transmission may be the same as that of the mother code. The coding rate may be determined based on the target BLER for the first transmission. The coded bits for the first transmission may be obtained by puncturing the parity check bits from the generated mother code (e.g., according to the selected coding rate). In some cases, uniform puncturing may be used to provide better performance. In some systems, the target BLER need not have a low value (e.g., a BLER of 10% may be suitable).

Generating Code for the Final Transmission

If the code in the first transmission is not decoded correctly, the receiver may feedback a NAK signal to the transmitter. In the final retransmission, the transmitter will send the coded parity bits as shown in FIGS. 6 and 7. The coding rate for the final retransmission is obtained according to the channel quality. The channel quality may be determined, for example, based on channel quality indicator (CQI) feedback.

If the obtained coding rate is not less than the coding rate in first transmission, all of the bits P2 punctured in first transmission may be transmitted. Sending all of the bits P2 helps to ensure that the desired performance for the second transmission is met.

If the obtained coding rate is less than the coding rate in first transmission, additional repetition bits may be transmitted to meet the target BLER for the second transmission. If repetition is needed, systematic information bits (i.e., data) may be repeated first (e.g., using uniform repetition). In addition, if all the systematic information bits are repeated, some or all of the parity bits may be repeated (e.g., uniformly) if there is room for the bits (e.g., depending on the modulation and coding scheme).

From the above, it should be appreciated that the BLER of the second transmission may be lower than that of existing algorithms because of the use of a larger block size when generating the mother code. Moreover, the disclosed algorithm can provide good throughput in terms of guaranteeing the target BLER of the second transmission. Also, the second transmission does not involve a separate Polar coding operation in contrast with the example of FIG. 4.

Figure 10:
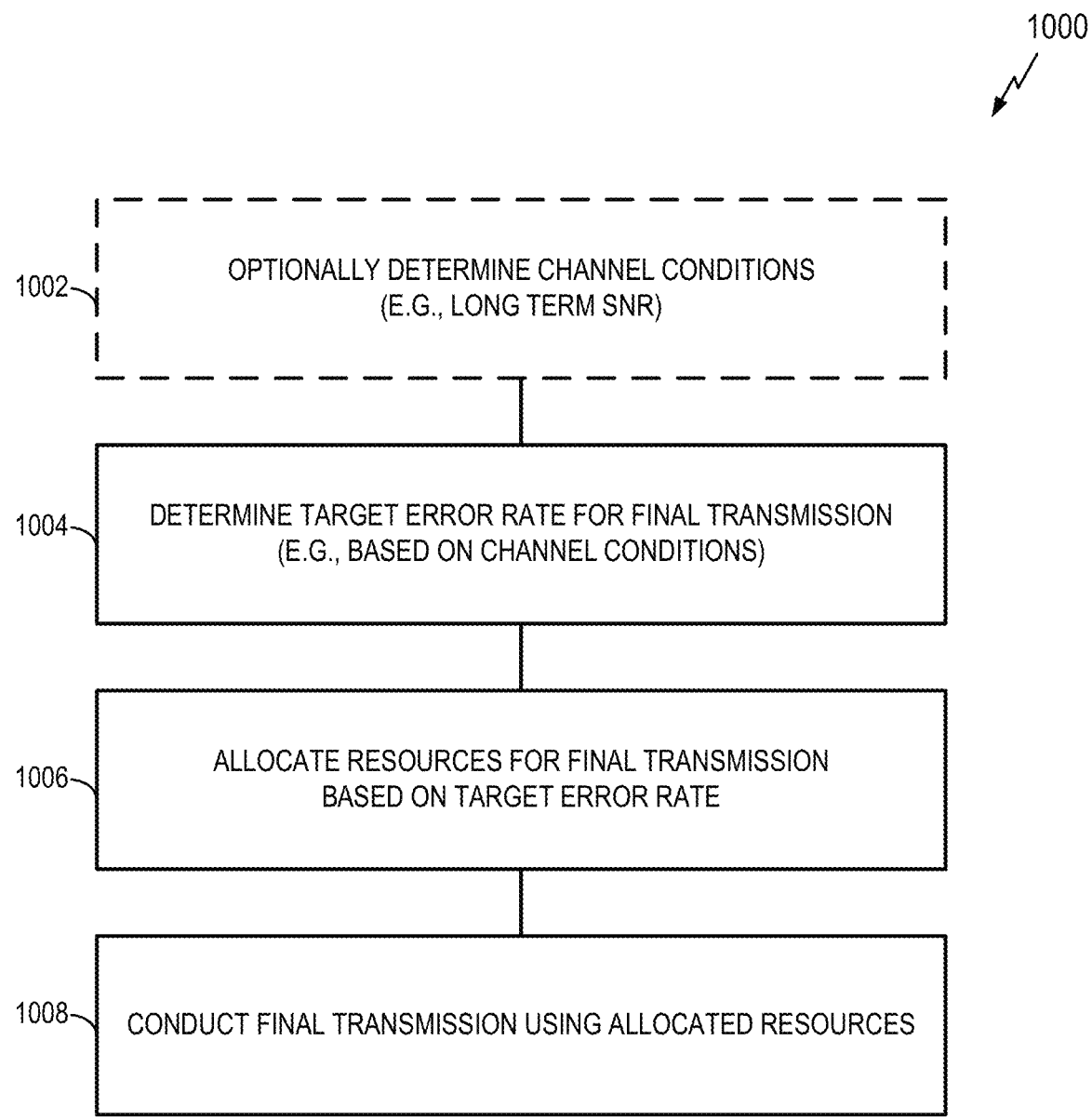
FIG. 10 is a flowchart illustrating an example of a process for conducting a final retransmission in accordance with some aspects of the disclosure.

FIG. 10 illustrates a process 1000 for sending a final retransmission in accordance with some aspects of the disclosure. The process 1000 may take place within a processing circuit (e.g., the processing circuit 1110 of FIG. 11), which may be located in a UE, a TRP, an access terminal, a base station, or some other suitable apparatus (e.g., that provides encoding). Of course, in various aspects within the scope of the disclosure, the process 1000 may be implemented by any suitable apparatus capable of supporting communication-related operations.

At optional block 1002, an apparatus (e.g., a device that includes an encoder) may determine the channel conditions. For example, the apparatus may monitor the long-term SNR.

At block 1004, the apparatus determine the target error rate (e.g., BLER) for the final transmission.

At block 1006, the apparatus allocates resources for the final transmission based on the target error rate.

At block 1008, the apparatus conducts the final transmission using the allocated resources.

In some aspects, the process 1000 may include any combination of two or more of the above features.

First Example Apparatus

Figure 11:
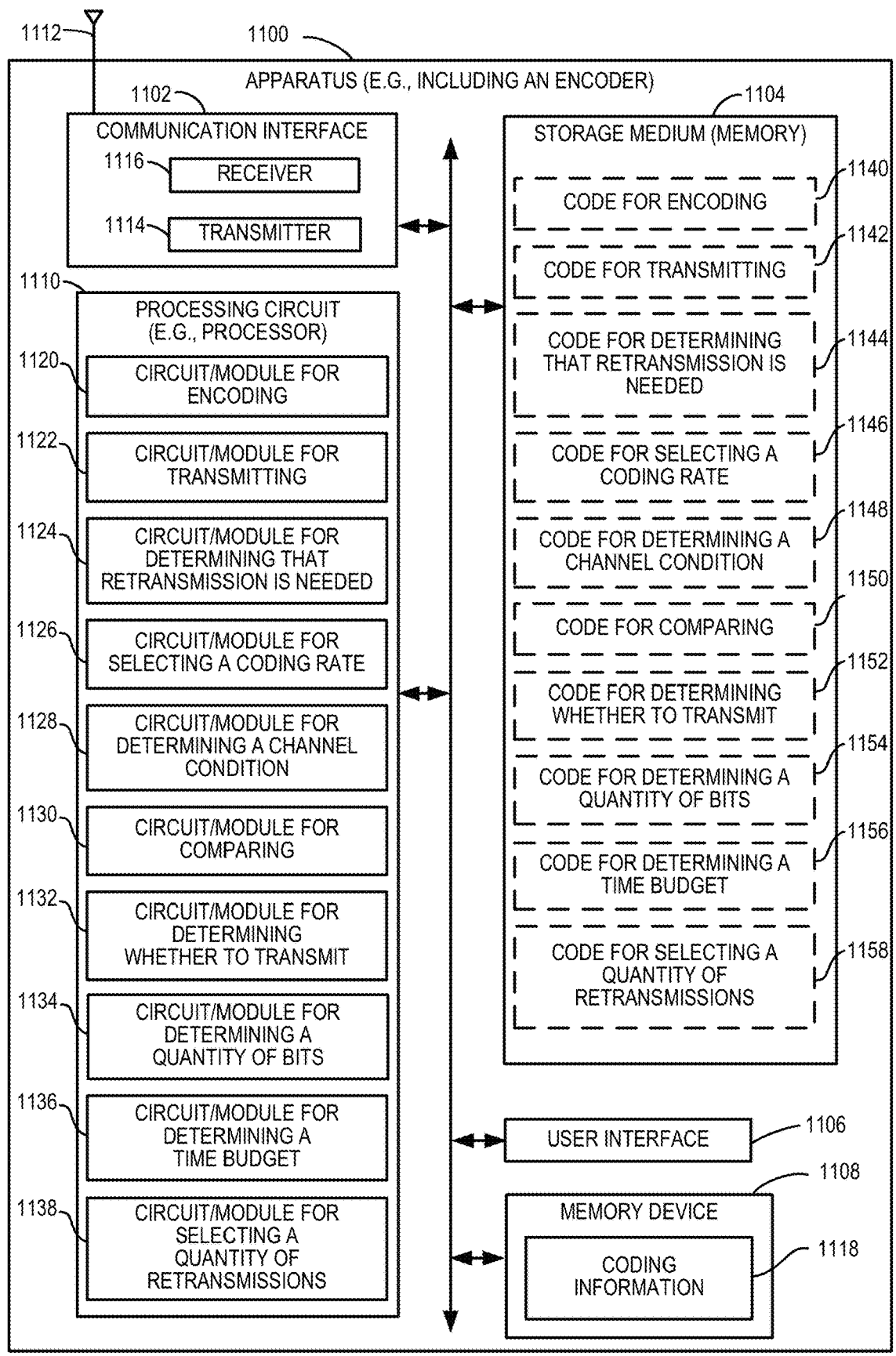
FIG. 11 is a block diagram illustrating an example hardware implementation for an apparatus (e.g., an electronic device) that can support encoding in accordance with some aspects of the disclosure.

FIG. 11 illustrates a block diagram of an example hardware implementation of an apparatus 1100 configured to use encoding according to one or more aspects of the disclosure. The apparatus 1100 could embody or be implemented within a UE, a transmit receive point (TRP), a base station, or some other type of device that supports encoding as taught herein. In various implementations, the apparatus 1100 could embody or be implemented within an access terminal, an access point, or some other type of device. In various implementations, the apparatus 1100 could embody or be implemented within a mobile phone, a smart phone, a tablet, a portable computer, a server, a network entity, a personal computer, a sensor, an alarm, a vehicle, a machine, an entertainment device, a medical device, or any other electronic device having circuitry.

The apparatus 1100 includes a communication interface 1102 (e.g., at least one transceiver), a storage medium 1104, a user interface 1106, a memory device 1108, and a processing circuit 1110 (e.g., at least one processor). These components can be coupled to and/or placed in electrical communication with one another via a signaling bus or other suitable component, represented generally by the connection lines in FIG. 11. The signaling bus may include any number of interconnecting buses and bridges depending on the specific application of the processing circuit 1110 and the overall design constraints. The signaling bus links together various circuits such that each of the communication interface 1102, the storage medium 1104, the user interface 1106, and the memory device 1108 are coupled to and/or in electrical communication with the processing circuit 1110. The signaling bus may also link various other circuits (not shown) such as timing sources, peripherals, voltage regulators, and power management circuits, which are well known in the art, and therefore, will not be described any further.

The communication interface 1102 may be adapted to facilitate wireless communication of the apparatus 1100. For example, the communication interface 1102 may include circuitry and/or programming adapted to facilitate the communication of information bi-directionally with respect to one or more communication devices in a network. Thus, in some implementations, the communication interface 1102 may be coupled to one or more antennas 1112 for wireless communication within a wireless communication system. In some implementations, the communication interface 1102 may be configured for wire-based communication. For example, the communication interface 1102 could be a bus interface, a send/receive interface, or some other type of signal interface including drivers, buffers, or other circuitry for outputting and/or obtaining signals (e.g., outputting signal from and/or receiving signals into an integrated circuit). The communication interface 1102 can be configured with one or more standalone receivers and/or transmitters, as well as one or more transceivers. In the illustrated example, the communication interface 1102 includes a transmitter 1114 and a receiver 1116.

The memory device 1108 may represent one or more memory devices. As indicated, the memory device 1108 may maintain coding-related information 1118 along with other information used by the apparatus 1100. In some implementations, the memory device 1108 and the storage medium 1104 are implemented as a common memory component. The memory device 1108 may also be used for storing data that is manipulated by the processing circuit 1110 or some other component of the apparatus 1100.

The storage medium 1104 may represent one or more computer-readable, machine-readable, and/or processor-readable devices for storing programming, such as processor executable code or instructions (e.g., software, firmware), electronic data, databases, or other digital information. The storage medium 1104 may also be used for storing data that is manipulated by the processing circuit 1110 when executing programming. The storage medium 1104 may be any available media that can be accessed by a general purpose or special purpose processor, including portable or fixed storage devices, optical storage devices, and various other mediums capable of storing, containing or carrying programming.

By way of example and not limitation, the storage medium 1104 may include a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The storage medium 1104 may be embodied in an article of manufacture (e.g., a computer program product). By way of example, a computer program product may include a computer-readable medium in packaging materials. In view of the above, in some implementations, the storage medium 1104 may be a non-transitory (e.g., tangible) storage medium.

The storage medium 1104 may be coupled to the processing circuit 1110 such that the processing circuit 1110 can read information from, and write information to, the storage medium 1104. That is, the storage medium 1104 can be coupled to the processing circuit 1110 so that the storage medium 1104 is at least accessible by the processing circuit 1110, including examples where at least one storage medium is integral to the processing circuit 1110 and/or examples where at least one storage medium is separate from the processing circuit 1110 (e.g., resident in the apparatus 1100, external to the apparatus 1100, distributed across multiple entities, etc.).

Programming stored by the storage medium 1104, when executed by the processing circuit 1110, causes the processing circuit 1110 to perform one or more of the various functions and/or process operations described herein. For example, the storage medium 1104 may include operations configured for regulating operations at one or more hardware blocks of the processing circuit 1110, as well as to utilize the communication interface 1102 for wireless communication utilizing their respective communication protocols. In some aspects, the storage medium 1104 may be a non-transitory computer-readable medium storing computer-executable code, including code to perform operations as described herein.

The processing circuit 1110 is generally adapted for processing, including the execution of such programming stored on the storage medium 1104. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise.

The processing circuit 1110 is arranged to obtain, process and/or send data, control data access and storage, issue commands, and control other desired operations. The processing circuit 1110 may include circuitry configured to implement desired programming provided by appropriate media in at least one example. For example, the processing circuit 1110 may be implemented as one or more processors, one or more controllers, and/or other structure configured to execute executable programming Examples of the processing circuit 1110 may include a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 1110 may also be implemented as a combination of computing components, such as a combination of a DSP and a microprocessor, a number of microprocessors, one or more microprocessors in conjunction with a DSP core, an ASIC and a microprocessor, or any other number of varying configurations. These examples of the processing circuit 1110 are for illustration and other suitable configurations within the scope of the disclosure are also contemplated.

According to one or more aspects of the disclosure, the processing circuit 1110 may be adapted to perform any or all of the features, processes, functions, operations and/or routines for any or all of the apparatuses described herein. For example, the processing circuit 1110 may be configured to perform any of the steps, functions, and/or processes described with respect to FIGS. 1-10 and 12-19. As used herein, the term "adapted" in relation to the processing circuit 1110 may refer to the processing circuit 1110 being one or more of configured, used, implemented, and/or programmed to perform a particular process, function, operation and/or routine according to various features described herein.

The processing circuit 1110 may be a specialized processor, such as an application specific integrated circuit (ASIC) that serves as a means for (e.g., structure for) carrying out any one of the operations described in conjunction with FIGS. 1-10 and 12-19. The processing circuit 1110 may serve as one example of a means for transmitting and/or a means for receiving. In various implementations, the processing circuit 1110 may provide and/or incorporate the functionality of the first wireless communication device 202 (e.g., the encoder 212) of FIG. 2 or the encoder 2402 of FIG. 24.

According to at least one example of the apparatus 1100, the processing circuit 1110 may include one or more of a circuit/module for encoding 1120, a circuit/module for transmitting 1122, a circuit/module for determining that retransmission is needed 1124, a circuit/module for selecting a coding rate 1126, a circuit/module for determining a channel condition 1128, a circuit/module for comparing 1130, a circuit/module for determining whether to transmit 1132, a circuit/module for determining a quantity of bits 1134, a circuit/module for determining a time budget 1136, or a circuit/module for selecting a quantity of retransmissions 1138. In various implementations, the circuit/module for encoding 1120, the circuit/module for transmitting 1122, the circuit/module for determining that retransmission is needed 1124, the circuit/module for selecting a coding rate 1126, the circuit/module for determining a channel condition 1128, the circuit/module for comparing 1130, the circuit/module for determining whether to transmit 1132, the circuit/module for determining a quantity of bits 1134, the circuit/module for determining a time budget 1136, or the circuit/module for selecting a quantity of retransmissions 1138 may provide and/or incorporate, at least in part, the functionality described above for the first wireless communication device 202 (e.g., the encoder 212) of FIG. 2 or the encoder 2402 of FIG. 24.

As mentioned above, programming stored by the storage medium 1104, when executed by the processing circuit 1110, causes the processing circuit 1110 to perform one or more of the various functions and/or process operations described herein. For example, the programming may cause the processing circuit 1110 to perform the various functions, steps, and/or processes described herein with respect to FIGS. 1-10 and 12-19 in various implementations. As shown in FIG. 11, the storage medium 1104 may include one or more of code for encoding 1140, code for transmitting 1142, code for determining that retransmission is needed 1144, code for selecting a coding rate 1146, code for determining a channel condition 1148, code for comparing 1150, code for determining whether to transmit 1152, code for determining a quantity of bits 1154, code for determining a time budget 1156, or code for selecting a quantity of retransmissions 1158. In various implementations, the code for encoding 1140, the code for transmitting 1142, the code for determining that retransmission is needed 1144, the code for selecting a coding rate 1146, the code for determining a channel condition 1148, the code for comparing 1150, the code for determining whether to transmit 1152, the code for determining a quantity of bits 1154, the code for determining a quantity of retransmissions time budget 1156, or the code for selecting a quantity of retransmissions 1158 may be executed or otherwise used to provide the functionality described herein for the circuit/module for encoding 1120, the circuit/module for transmitting 1122, the circuit/module for determining that retransmission is needed 1124, the circuit/module for selecting a coding rate 1126, the circuit/module for determining a channel condition 1128, the circuit/module for comparing 1130, the circuit/module for determining whether to transmit 1132, the circuit/module for determining a quantity of bits 1134, the circuit/module for determining a time budget 1136, or the circuit/module for selecting a quantity of retransmissions 1138.

The circuit/module for encoding 1120 may include circuitry and/or programming (e.g., code for encoding 1140 stored on the storage medium 1104) adapted to perform several functions relating to, for example, encoding information. In some aspects, the circuit/module for encoding 1120 (e.g., a means for encoding) may correspond to, for example, a processing circuit.

In some aspects, the circuit/module for encoding 1120 may execute an encoding algorithm. For example, the circuit/module for encoding 1120 may perform a block coding algorithm or a Polar coding algorithm. In some aspects, the circuit/module for encoding 1120 may perform the encoding operations described above in conjunction with FIGS. 2 and 5-10. The circuit/module for encoding 1120 then outputs the resulting encoded information (e.g., to the circuit/module for transmitting 1122, the communication interface 1102, the memory device 1108, or some other component).

The circuit/module for transmitting 1122 may include circuitry and/or programming (e.g., code for transmitting 1142 stored on the storage medium 1104) adapted to perform several functions relating to, for example, causing information to be transmitted. In some implementations, the circuit/module for transmitting 1122 may obtain information (e.g., from the circuit/module for encoding 1120, the memory device 1108, or some other component of the apparatus 1100), process the information (e.g., encode the information for transmission), and provide the information to another component (e.g., the transmitter 1114, the communication interface 1102, or some other component) that will transmit the information to another device. In some scenarios (e.g., if the circuit/module for transmitting 1122 is or includes a transmitter), the circuit/module for transmitting 1122 transmits the information directly to another device (e.g., the ultimate destination) via radio frequency signaling or some other type of signaling suitable for the applicable communication medium.

The circuit/module for transmitting 1122 (e.g., a means for transmitting) may take various forms. In some aspects, the circuit/module for transmitting 1122 may correspond to, for example, an interface (e.g., a bus interface, a send/receive interface, or some other type of signal interface), a communication device, a transceiver, a transmitter, or some other similar component as discussed herein. In some implementations, the communication interface 1102 includes the circuit/module for transmitting 1122 and/or the code for transmitting 1142. In some implementations, the circuit/module for transmitting 1122 and/or the code for transmitting 1142 is configured to control the communication interface 1102 (e.g., a transceiver or a transmitter) to transmit information.

The circuit/module for determining that retransmission is needed 1124 may include circuitry and/or programming (e.g., code for determining that retransmission is needed 1144 stored on the storage medium 1104) adapted to perform several functions relating to, for example, determining whether to perform a retransmission. In some aspects, the circuit/module for determining that retransmission is needed 1124 (e.g., a means for determining that retransmission is needed) may correspond to, for example, a processing circuit.

In some scenarios, the circuit/module for determining that retransmission is needed 1124 may obtain feedback information. For example, the circuit/module for determining that retransmission is needed 1124 may obtain an ACK or NAK (e.g., from the communication interface 1102, the memory device 1108, or some other component of the apparatus 1100). The circuit/module for determining that retransmission is needed 1124 may elect to retransmit if the feedback is a NAK or some other similar value. The circuit/module for determining that retransmission is needed 1124 may then output an indication of the determination (e.g., to the circuit/module for transmitting 1122, the memory device 1108, or some other component).

The circuit/module for selecting a coding rate 1126 may include circuitry and/or programming (e.g., code for selecting a coding rate 1146 stored on the storage medium 1104) adapted to perform several functions relating to, for example, selecting a coding rate for encoding information. In some aspects, the circuit/module for selecting a coding rate 1126 (e.g., a means for selecting a coding rate) may correspond to, for example, a processing circuit.

The circuit/module for selecting a coding rate 1126 may select a coding rate based on various inputs. For example, the circuit/module for selecting a coding rate 1126 may select a coding rate based on a target error rate, a channel condition, or some other input. Thus, the circuit/module for selecting a coding rate 1126 may initially obtain input information (e.g., from the circuit/module for determining a channel condition 1128, the memory device 1108, or some other component of the apparatus 1100). The circuit/module for circuit/module for selecting a coding rate 1126 can thus determine the coding rate to be used based on the appropriate input (e.g., as discussed above in conjunction with FIGS. 5-10). The circuit/module for selecting a coding rate 1126 may then output an indication of the selection (e.g., to the circuit/module for encoding 1120, the circuit/module for transmitting 1122, the circuit/module for determining a quantity of bits 1134, the memory device 1108, an encoder, or some other component).

The circuit/module for determining a channel condition 1128 may include circuitry and/or programming (e.g., code for determining a channel condition 1148 stored on the storage medium 1104) adapted to perform several functions relating to, for example, determining a condition of a channel over a period of time. In some aspects, the circuit/module for determining a channel condition 1128 (e.g., a means for determining a channel condition) may correspond to, for example, a processing circuit.

In some scenarios, the circuit/module for determining a channel condition 1128 may invoke channel measurements. For example, the circuit/module for determining a channel condition 1128 may control the communication interface 1102 to monitor the channel (and optionally send patterns for channel measurements by another device), or control some other component of the apparatus 1100. The circuit/module for determining a channel condition 1128 can therefore obtain received signal information and process this information to generate at least one channel estimate. The circuit/module for determining a channel condition 1128 may then output an indication of the channel estimate (e.g., to the circuit/module for selecting a coding rate 1126, the memory device 1108, or some other component).

The circuit/module for comparing 1130 may include circuitry and/or programming (e.g., code for comparing 1150 stored on the storage medium 1104) adapted to perform several functions relating to, for example, comparing two values. In some aspects, the circuit/module for comparing 1130 (e.g., a means for comparing) may correspond to, for example, a processing circuit.

In one scenario, the circuit/module for comparing 1130 obtains a first coding rate and a second coding rate (e.g., from the circuit/module for selecting a coding rate 1126, the memory device 1108, or some other component of the apparatus 1100). The circuit/module for comparing 1130 determines which one of these value is larger than the other one of these values (e.g., by performing a subtraction operation). The circuit/module for comparing 1130 may then output the result of this determination (e.g., to the circuit/module for determining whether to transmit 1132, the memory device 1108, or some other component).

The circuit/module for determining whether to transmit 1132 may include circuitry and/or programming (e.g., code for determining whether to transmit 1152 stored on the storage medium 1104) adapted to perform several functions relating to, for example, determining whether to transmit information to another apparatus. In some aspects, the circuit/module for determining whether to transmit 1132 (e.g., a means for determining whether to transmit) may correspond to, for example, a processing circuit.

In some scenarios, the circuit/module for determining whether to transmit 1132 may determine whether to transmit repetition information. For example, the circuit/module for determining whether to transmit 1132 may determine whether an obtained coding rate is less than the coding rate of a first transmission. If so, repetition bits may need to be transmitted to meet the target BLER for the second transmission. The circuit/module for determining whether to transmit 1132 may then output an indication of the above determination (e.g., to the circuit/module for transmitting 1122, the communication interface 1102, the memory device 1108, or some other component).

The circuit/module for determining a quantity of bits 1134 may include circuitry and/or programming (e.g., code for determining a quantity of bits 1154 stored on the storage medium 1104) adapted to perform several functions relating to, for example, determining how many bits to use for repetition. In some aspects, the circuit/module for determining a quantity of bits 1134 (e.g., a means for determining a quantity of bits) may correspond to, for example, a processing circuit.

The circuit/module for determining a quantity of bits 1134 may determine the quantity of bits based on a coding rate. For example, if repetition is needed, the circuit/module for determining a quantity of bits 1134 may elect to repeat systematic information bits first (e.g., using uniform repetition). In addition, if all of the systematic information bits are repeated, some or all of the parity bits may be repeated (e.g., uniformly) if there is room for the bits (e.g., depending on the modulation and coding scheme). Thus, the circuit/module for determining a quantity of bits 1134 may obtain coding rate information (e.g., from the circuit/module for selecting a coding rate 1126, the memory device 1108, or some other component of the apparatus 1100). The circuit/module for determining a quantity of bits 1134 then calculates the number of bits to use based on the coding rate information (e.g., as discussed above). The circuit/module for determining a quantity of bits 1134 may then output an indication of the number of bits (e.g., to the circuit/module for encoding 1120, the memory device 1108, an encoder, or some other component).

The circuit/module for determining a time budget 1136 may include circuitry and/or programming (e.g., code for determining a time budget 1156 stored on the storage medium 1104) adapted to perform several functions relating to, for example, determining a time budget for retransmissions. In some aspects, the circuit/module for determining a time budget 1136 (e.g., a means for determining a time budget) may correspond to, for example, a processing circuit.

The circuit/module for determining a time budget 1136 may determine the time budget based on the frame structure being used or some other indication of a turn-around time or a communication allocation. Thus, the circuit/module for determining a time budget 1136 may initially obtain the appropriate input (e.g., from the communication interface 1102, the memory device 1108, or some other component of the apparatus 1100). The circuit/module for determining a time budget 1136 then calculates the time budget based on the input information (e.g., based on the number of frames allocated for transmission prior to a turn-around for reception). The circuit/module for determining a time budget 1136 may then output an indication of the calculated time budget (e.g., to the circuit/module for selecting a quantity of retransmissions 1138, the memory device 1108, or some other component).

The circuit/module for selecting a quantity of retransmissions 1138 may include circuitry and/or programming (e.g., code for selecting a quantity of retransmissions 1158 stored on the storage medium 1104) adapted to perform several functions relating to, for example, determining how many retransmissions can be performed. In some aspects, the circuit/module for selecting a quantity of retransmissions 1138 (e.g., a means for selecting a quantity of retransmissions) may correspond to, for example, a processing circuit.

The circuit/module for selecting a quantity of retransmissions 1138 may determine the number of retransmission to perform based on a time budget. Thus, the circuit/module for selecting a quantity of retransmissions 1138 may obtain time budget information (e.g., from the circuit/module for determining a time budget 1136, the memory device 1108, or some other component of the apparatus 1100). The circuit/module for selecting a quantity of retransmissions 1138 then calculates the number of retransmissions based on the time budget information (e.g., by dividing the time budget by the time it takes to complete a retransmission). The circuit/module for selecting a quantity of retransmissions 1138 may then output an indication of the calculated number of retransmissions (e.g., to the circuit/module for transmitting 1122, the memory device 1108, or some other component).

First Example Process

Figure 12:
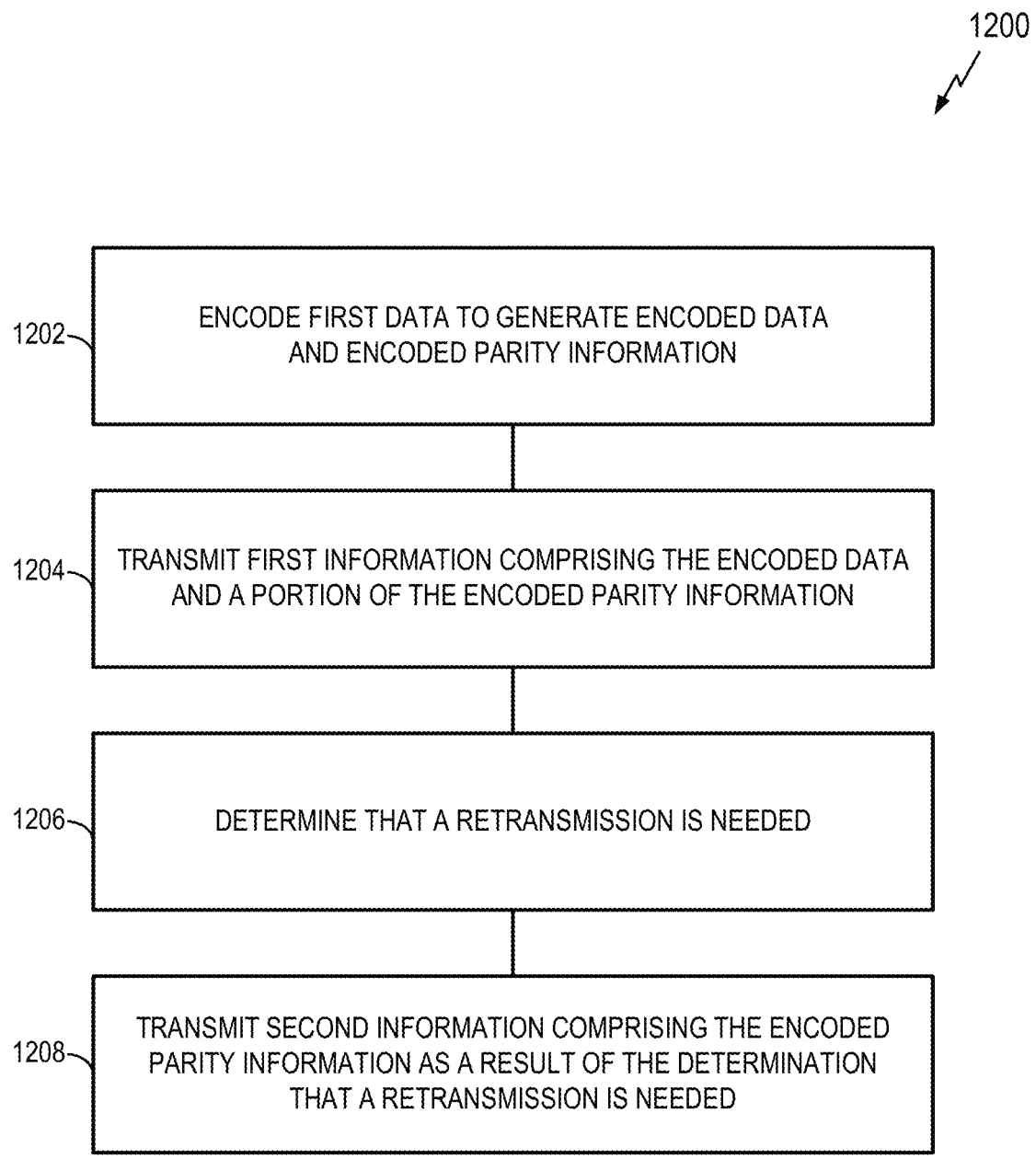
FIG. 12 is a flowchart illustrating an example of an encoding process in accordance with some aspects of the disclosure.

FIG. 12 illustrates a process 1200 for communication in accordance with some aspects of the disclosure. The process 1200 may take place within a processing circuit (e.g., the processing circuit 1110 of FIG. 11), which may be located in a UE, a TRP, an access terminal, a base station, or some other suitable apparatus (e.g., that provides encoding). Of course, in various aspects within the scope of the disclosure, the process 1200 may be implemented by any suitable apparatus capable of supporting communication-related operations.

At block 1202, an apparatus (e.g., a device that includes an encoder) encodes first data to generate encoded data and encoded parity information. In some aspects, the encoding may include Polar coding. In some aspects, the encoding may include systematic Polar coding.

In some implementations, the circuit/module for encoding 1120 of FIG. 11 performs the operations of block 1202. In some implementations, the code for encoding 1140 of FIG. 11 is executed to perform the operations of block 1202.

At block 1204, the apparatus transmits first information that includes the encoded data and a portion of the encoded parity information from block 1202. In some aspects, the operations of block 1204 may be associated with a first transmission.

In some implementations, the circuit/module for transmitting 1122 of FIG. 11 performs the operations of block 1204. In some implementations, the code for transmitting 1142 of FIG. 11 is executed to perform the operations of block 1204.

At block 1206, the apparatus determines that a retransmission is needed.

In some implementations, the circuit/module for determining that retransmission is needed 1124 of FIG. 11 performs the operations of block 1206. In some implementations, the code for determining that retransmission is needed 1144 of FIG. 11 is executed to perform the operations of block 1206.

At block 1208, the apparatus transmits second information as a result of the determination that a retransmission is needed of block 1206. In some aspects, the second information may include at least a portion of the encoded parity information (e.g., parity information generated at block 1202 that was not included in the first information).

In some implementations, the circuit/module for transmitting 1122 of FIG. 11 performs the operations of block 1208. In some implementations, the code for transmitting 1142 of FIG. 11 is executed to perform the operations of block 1208.

In some aspects, the process 1200 may further include transmitting at least a third information after the transmitting of the first information and before the transmitting of the second information. In some aspects, the transmitting of the second information is a final transmission for the first data (e.g., a final transmission for the HARQ process associated with transmission of the first data).

In some aspects, the process 1200 may further include selecting a first coding rate to meet a target error rate for the transmission of the second information. In this case, the first data may be encoded according to the first coding rate. In some aspects, the process 1200 may further include determining a condition of a channel (e.g., a signal-to-noise ratio (SNR) for the channel) over a period to time. In this case, the first coding rate may be selected based on the SNR. In some aspects, the process 1200 may further include selecting a second coding rate to meet a target error rate for the transmission of the first information. In this case, the first information may be transmitted according to the second coding rate.

In some aspects, the second information may include repetition information. In some aspects, the repetition information may include the encoded data. In some aspects, the repetition information may include at least a portion of the encoded parity information. In some aspects, the process 1200 may further include comparing a first coding rate for the transmission of the first information to a second coding rate for the transmission of the second information, and determining, based on the comparison, whether to transmit the repetition information. In some aspects, the process 1200 may further include determining a quantity of bits for the repetition information based on a coding rate for the transmission of the second information.

In some aspects, the process 1200 may further include selecting a quantity of retransmissions based on a time budget.

In some aspects, the process 1200 may include any combination of two or more of the above features.

Second Example Process

Figure 13:
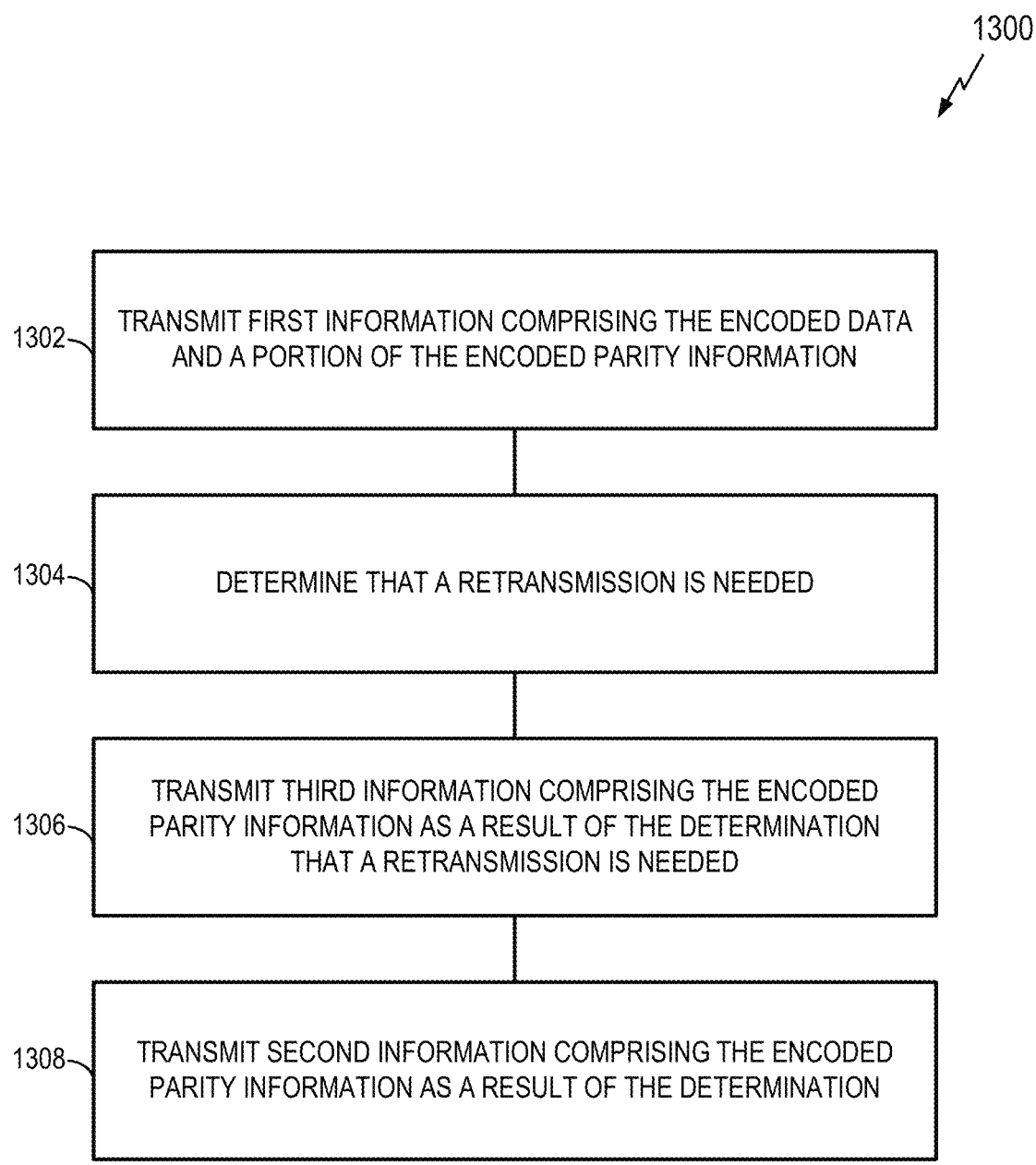
FIG. 13 is a flowchart illustrating an example of an encoding process with multiple retransmissions in accordance with some aspects of the disclosure.

FIG. 13 illustrates a process 1300 for communication in accordance with some aspects of the disclosure. One or more aspects of the process 1300 may be used in conjunction with (e.g., in addition to or as part of) the process 1200 of FIG. 12. The process 1300 may take place within a processing circuit (e.g., the processing circuit 1110 of FIG. 11), which may be located in a UE, a TRP, an access terminal, a base station, or some other suitable apparatus (e.g., that provides encoding). Of course, in various aspects within the scope of the disclosure, the process 1300 may be implemented by any suitable apparatus capable of supporting communication-related operations.

At block 1302, an apparatus (e.g., a device that includes an encoder) transmits first information that includes the encoded data and a portion of the encoded parity information. In some aspects, the operations of block 1302 may correspond to the operations of block 1204 of FIG. 12.

In some implementations, the circuit/module for transmitting 1122 of FIG. 11 performs the operations of block 1302. In some implementations, the code for transmitting 1142 of FIG. 11 is executed to perform the operations of block 1302.

At block 1304, the apparatus determines that a retransmission is needed. In some aspects, the operations of block 1304 may correspond to the operations of block 1206 of FIG. 12.

In some implementations, the circuit/module for determining that retransmission is needed 1124 of FIG. 11 performs the operations of block 1304. In some implementations, the code for determining that retransmission is needed 1144 of FIG. 11 is executed to perform the operations of block 1304.

At block 1306, the apparatus transmits third information as a result of the determination that a retransmission is needed of block 1304. In some scenarios, the third information may be the same as or similar to the first information transmitted at block 1302.

In some implementations, the circuit/module for transmitting 1122 of FIG. 11 performs the operations of block 1306. In some implementations, the code for transmitting 1142 of FIG. 11 is executed to perform the operations of block 1306.

At block 1308, the apparatus transmits second information as a result of the determination of block 1306 (or a subsequent determination that at least one other retransmission is needed). In some aspects, the operations of block 1308 may correspond to the operations of block 1208 of FIG. 12. Thus, the second information may include at least a portion of the encoded parity information that was not included in the first information. In some aspects, the transmission of the second information is a final transmission for the first data (e.g., a final transmission for the HARQ process associated with transmission of the first data).

In some implementations, the circuit/module for transmitting 1122 of FIG. 11 performs the operations of block 1308. In some implementations, the code for transmitting 1142 of FIG. 11 is executed to perform the operations of block 1308.

In some aspects, the process 1300 may include any combination of two or more of the above features.

Third Example Process

Figure 14:
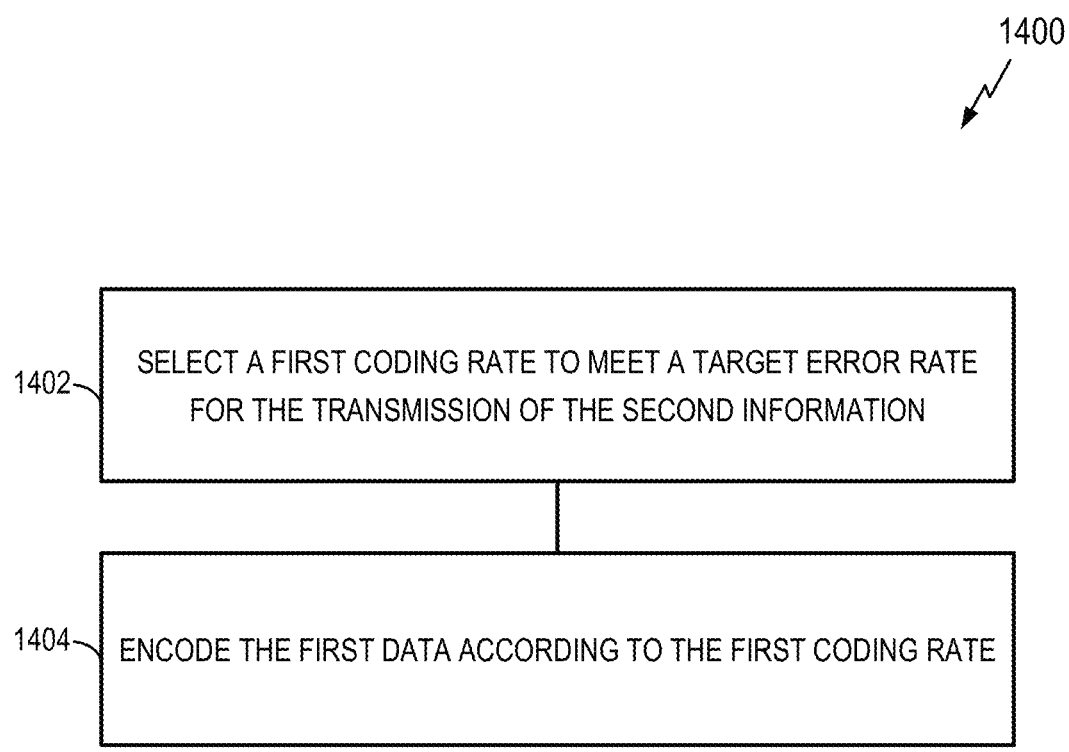
FIG. 14 is a flowchart illustrating an example of a process for encoding data at a rate that is based on a target error rate for another transmission in accordance with some aspects of the disclosure.

FIG. 14 illustrates a process 1400 for communication in accordance with some aspects of the disclosure. One or more aspects of the process 1400 may be used in conjunction with (e.g., in addition to or as part of) the process 1200 of FIG. 12 and/or the process 1300 of FIG. 13. For example, the process 1400 may correspond, at least in some aspects, to block 1202 of FIG. 12. The process 1400 may take place within a processing circuit (e.g., the processing circuit 1110 of FIG. 11), which may be located in a UE, a TRP, an access terminal, a base station, or some other suitable apparatus (e.g., that provides encoding). Of course, in various aspects within the scope of the disclosure, the process 1400 may be implemented by any suitable apparatus capable of supporting communication-related operations.

At block 1402, an apparatus (e.g., a device that includes an encoder) selects a first coding rate to meet a target error rate for the transmission of the second information (e.g., at block 1208 of FIG. 12).

In some implementations, the circuit/module for selecting a coding rate 1126 of FIG. 11 performs the operations of block 1402. In some implementations, the code for selecting a coding rate 1146 of FIG. 11 is executed to perform the operations of block 1402.

At block 1404, the apparatus encodes the first data according to the first coding rate.

In some implementations, the circuit/module for encoding 1120 of FIG. 11 performs the operations of block 1404. In some implementations, the code for encoding 1140 of FIG. 11 is executed to perform the operations of block 1404.

In some aspects, the process 1400 may include any combination of two or more of the above features.

Fourth Example Process

Figure 15:
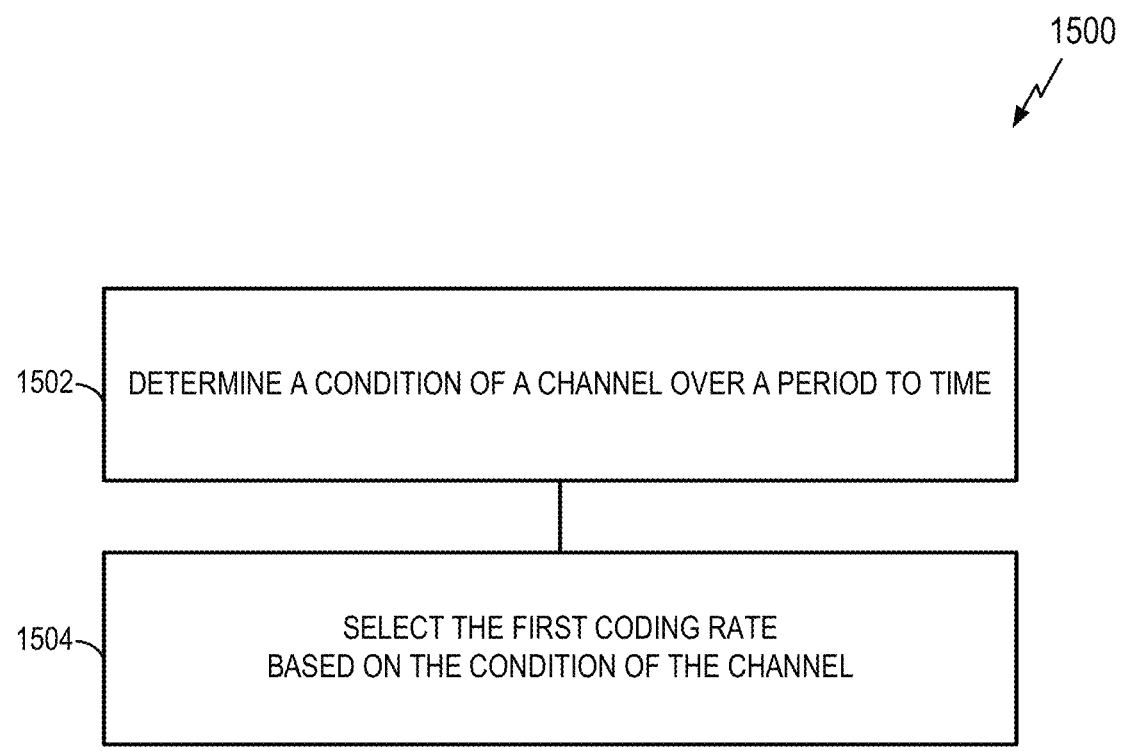
FIG. 15 is a flowchart illustrating an example of a process for selecting a coding rate based on a channel condition in accordance with some aspects of the disclosure.

FIG. 15 illustrates a process 1500 for communication in accordance with some aspects of the disclosure. One or more aspects of the process 1500 may be used in conjunction with (e.g., in addition to or as part of) the process 1200 of FIG. 12 and/or the process 1300 of FIG. 13. For example, the process 1500 may correspond, at least in some aspects, to block 1402 of FIG. 14. The process 1500 may take place within a processing circuit (e.g., the processing circuit 1110 of FIG. 11), which may be located in a UE, a TRP, an access terminal, a base station, or some other suitable apparatus (e.g., that provides encoding). Of course, in various aspects within the scope of the disclosure, the process 1500 may be implemented by any suitable apparatus capable of supporting communication-related operations.

At block 1502, an apparatus (e.g., a device that includes an encoder) determines a condition of a channel over a period of time.

In some implementations, the circuit/module for determining a channel condition 1128 of FIG. 11 performs the operations of block 1502. In some implementations, the code for determining a channel condition 1148 of FIG. 11 is executed to perform the operations of block 1502.

At block 1504, the apparatus selects the first coding rate based on the condition of the channel. For example, the target error rate of block 1402 of FIG. 14 may be calculated based on the channel condition determined at block 1502. Thus, the selection of the first coding rate to meet the target error rate may be based on the channel condition.

In some implementations, the circuit/module for selecting a coding rate 1126 of FIG. 11 performs the operations of block 1504. In some implementations, the code for selecting a coding rate 1146 of FIG. 11 is executed to perform the operations of block 1504.

In some aspects, the process 1500 may include any combination of two or more of the above features.

Fifth Example Process

Figure 16:
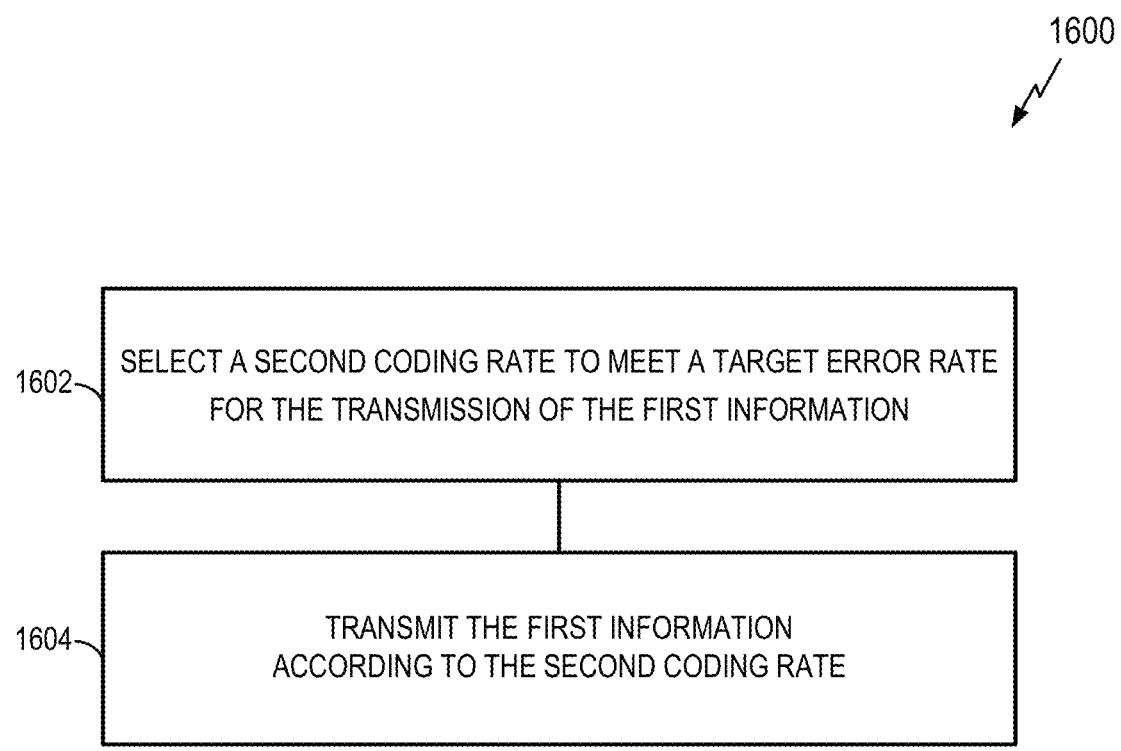
FIG. 16 is a flowchart illustrating an example of a process for transmitting data at a rate that is based on a target error rate in accordance with some aspects of the disclosure.

FIG. 16 illustrates a process 1600 for communication in accordance with some aspects of the disclosure. One or more aspects of the process 1600 may be used in conjunction with (e.g., in addition to or as part of) the process 1200 of FIG. 12 and/or the process 1300 of FIG. 13. For example, the process 1600 may correspond, at least in some aspects, to block 1204 of FIG. 12. The process 1600 may take place within a processing circuit (e.g., the processing circuit 1110 of FIG. 11), which may be located in a UE, a TRP, an access terminal, a base station, or some other suitable apparatus (e.g., that provides encoding). Of course, in various aspects within the scope of the disclosure, the process 1600 may be implemented by any suitable apparatus capable of supporting communication-related operations.

At block 1602, an apparatus (e.g., a device that includes an encoder) selects a second coding rate to meet a target error rate for the transmission of the first information. For example, this coding rate may be used to determine the puncturing to be applied to a mother code.

In some implementations, the circuit/module for selecting a coding rate 1126 of FIG. 11 performs the operations of block 1602. In some implementations, the code for selecting a coding rate 1146 of FIG. 11 is executed to perform the operations of block 1602.

At block 1604, the apparatus transmits the first information according to the second coding rate. For example, this transmission may correspond to the first transmission 612 of FIG. 6.

In some implementations, the circuit/module for transmitting 1122 of FIG. 11 performs the operations of block 1604. In some implementations, the code for transmitting 1142 of FIG. 11 is executed to perform the operations of block 1604.

In some aspects, the process 1600 may include any combination of two or more of the above features.

Sixth Example Process

Figure 17:
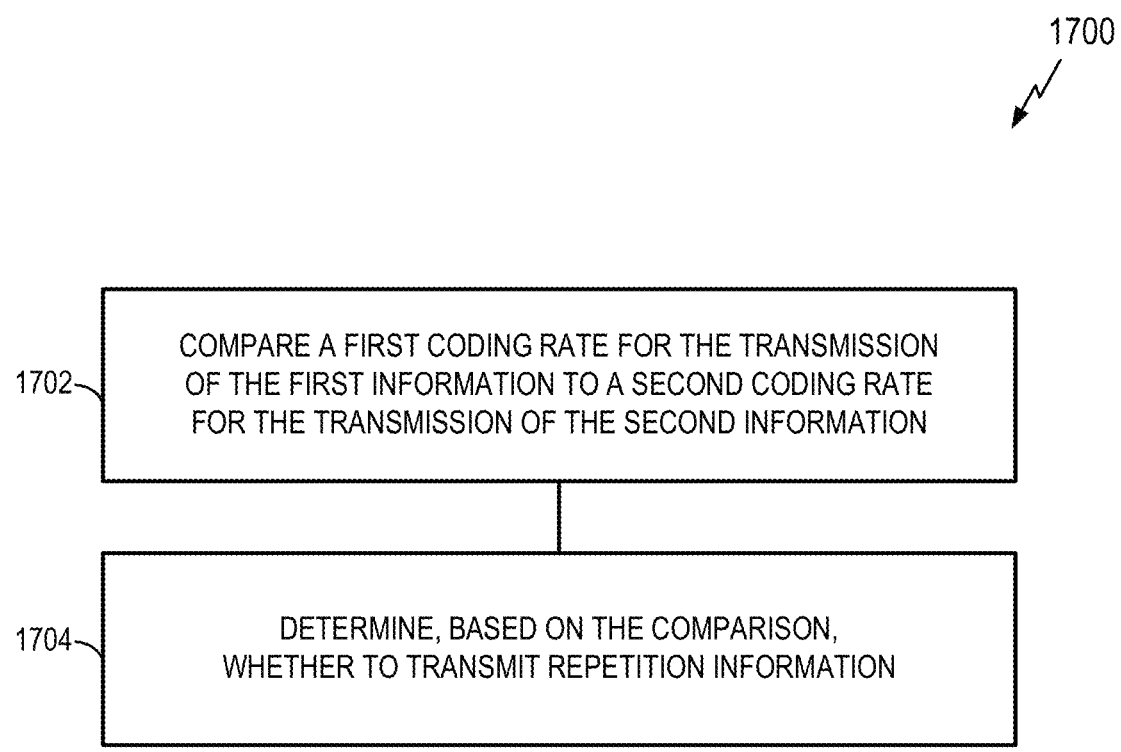
FIG. 17 is a flowchart illustrating an example of a process for determining whether to transmit repetition information in accordance with some aspects of the disclosure.

FIG. 17 illustrates a process 1700 for communication in accordance with some aspects of the disclosure. One or more aspects of the process 1700 may be used in conjunction with (e.g., in addition to or as part of) the process 1200 of FIG. 12 and/or the process 1300 of FIG. 13. For example, the process 1700 may correspond, at least in some aspects, to block 1208 of FIG. 12. The process 1700 may take place within a processing circuit (e.g., the processing circuit 1110 of FIG. 11), which may be located in a UE, a TRP, an access terminal, a base station, or some other suitable apparatus (e.g., that provides encoding). Of course, in various aspects within the scope of the disclosure, the process 1700 may be implemented by any suitable apparatus capable of supporting communication-related operations.

At block 1702, an apparatus (e.g., a device that includes an encoder) compares a first coding rate for the transmission of the first information to a second coding rate for the transmission of the second information. For example, the first coding rate of block 1402 of FIG. 14 may be compared to the second coding rate of block 1802 of FIG. 18.

In some implementations, the circuit/module for comparing 1130 of FIG. 11 performs the operations of block 1702. In some implementations, the code for comparing 1150 of FIG. 11 is executed to perform the operations of block 1702.

At block 1704, the apparatus determines, based on the comparison, whether to transmit repetition information. For example, the apparatus may transmit the repetition information if the second coding rate is less than the first coding rate.

In some implementations, the circuit/module for determining whether to transmit 1132 of FIG. 11 performs the operations of block 1704. In some implementations, the code for determining whether to transmit 1152 of FIG. 11 is executed to perform the operations of block 1704.

In some aspects, the process 1700 may include any combination of two or more of the above features.

Seventh Example Process

Figure 18:
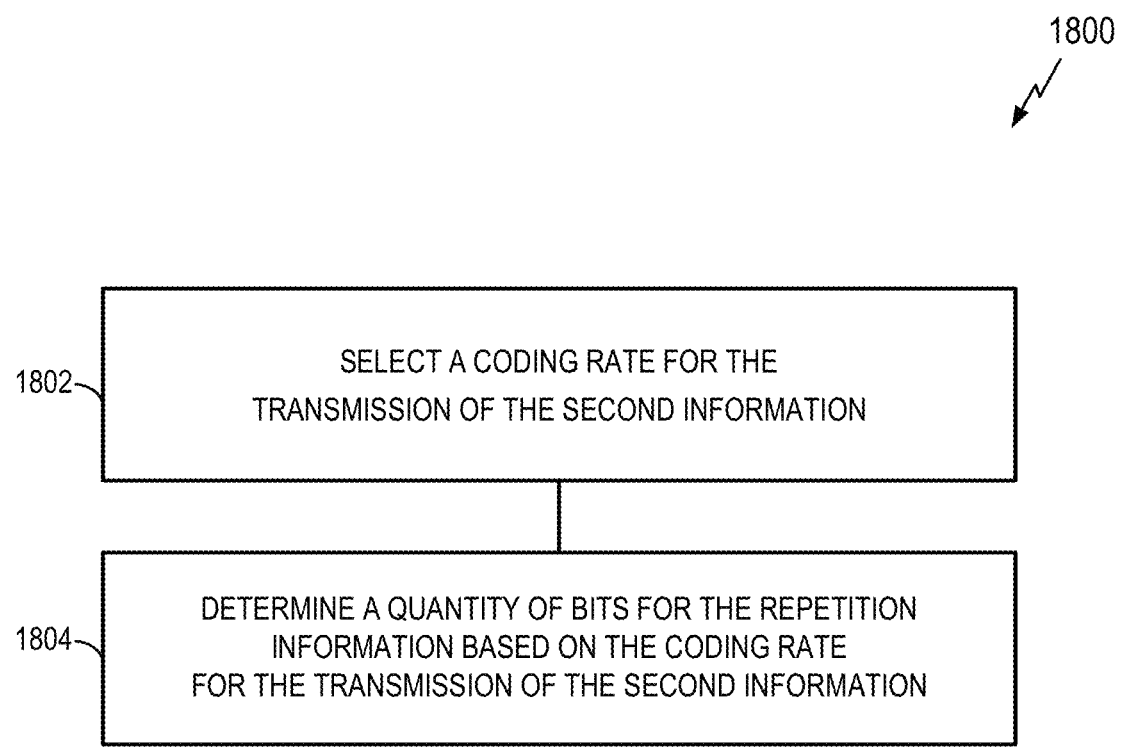
FIG. 18 is a flowchart illustrating an example of a process for determining a quantity of bits for repetition information in accordance with some aspects of the disclosure.

FIG. 18 illustrates a process 1800 for communication in accordance with some aspects of the disclosure. One or more aspects of the process 1800 may be used in conjunction with (e.g., in addition to or as part of) the process 1200 of FIG. 12 and/or the process 1300 of FIG. 13. For example, the process 1800 may correspond, at least in some aspects, to block 1208 of FIG. 12. The process 1800 may take place within a processing circuit (e.g., the processing circuit 1110 of FIG. 11), which may be located in a UE, a TRP, an access terminal, a base station, or some other suitable apparatus (e.g., that provides encoding). Of course, in various aspects within the scope of the disclosure, the process 1800 may be implemented by any suitable apparatus capable of supporting communication-related operations.

At block 1802, an apparatus (e.g., a device that includes an encoder) selects a coding rate for the transmission of the second information. In some aspects, this selection may be based on CQI feedback.

In some implementations, the circuit/module for selecting a coding rate 1126 of FIG. 11 performs the operations of block 1802. In some implementations, the code for selecting a coding rate 1146 of FIG. 11 is executed to perform the operations of block 1802.

At block 1804, the apparatus determines a quantity of bits for the repetition information based on a coding rate for the transmission of the second information. For example, additional repetition bits may be used if the coding rate allows for the additional bits.

In some implementations, the circuit/module for determining a quantity of bits 1134 of FIG. 11 performs the operations of block 1804. In some implementations, the code for determining a quantity of bits 1154 of FIG. 11 is executed to perform the operations of block 1804.

In some aspects, the process 1800 may include any combination of two or more of the above features.

Eighth Example Process

Figure 19:
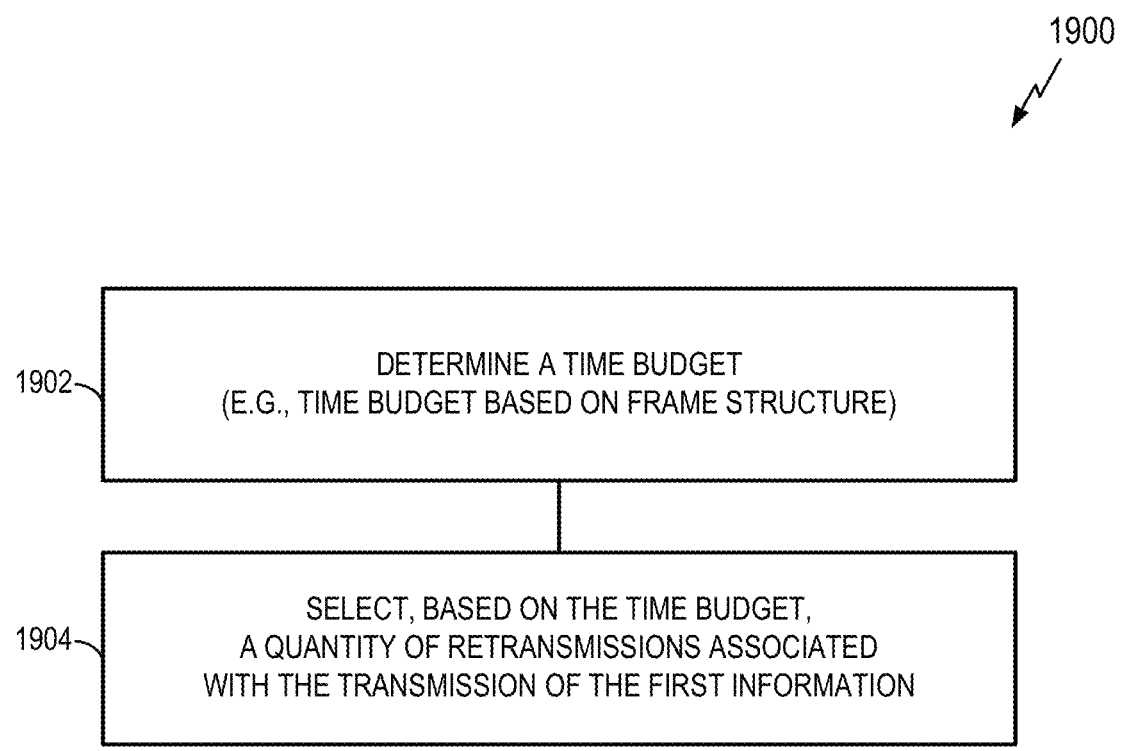
FIG. 19 is a flowchart illustrating an example of a process for determining a quantity of retransmissions in accordance with some aspects of the disclosure.

FIG. 19 illustrates a process 1900 for communication in accordance with some aspects of the disclosure. One or more aspects of the process 1900 may be used in conjunction with (e.g., in addition to or as part of) the process 1200 of FIG. 12 and/or the process 1300 of FIG. 13. The process 1900 may take place within a processing circuit (e.g., the processing circuit 1110 of FIG. 11), which may be located in a UE, a TRP, an access terminal, a base station, or some other suitable apparatus (e.g., that provides encoding). Of course, in various aspects within the scope of the disclosure, the process 1900 may be implemented by any suitable apparatus capable of supporting communication-related operations.

At block 1902, an apparatus (e.g., a device that includes an encoder) determines a time budget. For example, the apparatus may calculate the time budget based on the frame structure to be used for a HARQ process.

In some implementations, the circuit/module for determining a time budget 1136 of FIG. 11 performs the operations of block 1902. In some implementations, the code for determining a time budget 1156 of FIG. 11 is executed to perform the operations of block 1902.

At block 1904, the apparatus selects, based on the time budget, a quantity of retransmissions associated with the transmission of the first information. For example, the apparatus may determine the quantity of expected retransmissions by dividing the time budget by the duration of a retransmission (e.g., the maximum amount of time that a retransmission would take).

In some implementations, the circuit/module for selecting a quantity of retransmissions 1138 of FIG. 11 performs the operations of block 1904. In some implementations, the code for selecting a quantity of retransmissions 1158 of FIG. 11 is executed to perform the operations of block 1904.

In some aspects, the process 1900 may include any combination of two or more of the above features.

Second Example Apparatus

Figure 20:
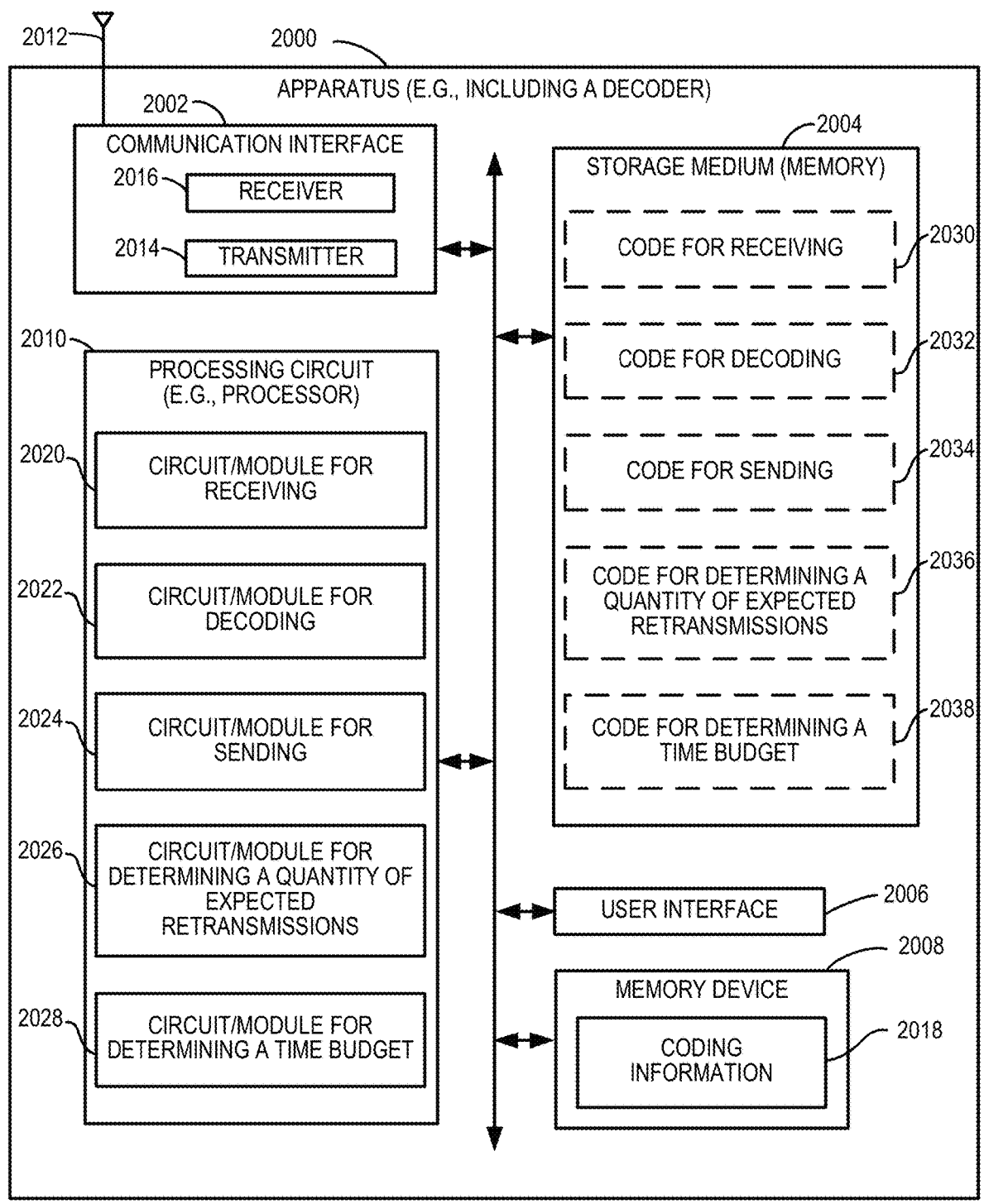
FIG. 20 is a block diagram illustrating an example hardware implementation for an apparatus (e.g., an electronic device) that can support decoding in accordance with some aspects of the disclosure.

FIG. 20 illustrates a block diagram of an example hardware implementation of an apparatus 2000 configured to use encoding according to one or more aspects of the disclosure. The apparatus 2000 could embody or be implemented within a UE, a transmit receive point (TRP), a base station, or some other type of device that supports encoding as taught herein. In various implementations, the apparatus 2000 could embody or be implemented within an access terminal, an access point, or some other type of device. In various implementations, the apparatus 2000 could embody or be implemented within a mobile phone, a smart phone, a tablet, a portable computer, a server, a network entity, a personal computer, a sensor, an alarm, a vehicle, a machine, an entertainment device, a medical device, or any other electronic device having circuitry.

The apparatus 2000 includes a communication interface (e.g., at least one transceiver) 2002, a storage medium 2004, a user interface 2006, a memory device 2008 (e.g., storing coding information 2018), and a processing circuit (e.g., at least one processor) 2010. In various implementations, the user interface 2006 may include one or more of: a keypad, a display, a speaker, a microphone, a touchscreen display, of some other circuitry for receiving an input from or sending an output to a user. The communication interface 2002 may be coupled to one or more antennas 2012, and may include a transmitter 2014 and a receiver 2016. In general, the components of FIG. 20 may be similar to corresponding components of the apparatus 1100 of FIG. 11.

According to one or more aspects of the disclosure, the processing circuit 2010 may be adapted to perform any or all of the features, processes, functions, operations and/or routines for any or all of the apparatuses described herein. For example, the processing circuit 2010 may be configured to perform any of the steps, functions, and/or processes described with respect to FIGS. 1-10 and 21-23. As used herein, the term "adapted" in relation to the processing circuit 2010 may refer to the processing circuit 2010 being one or more of configured, used, implemented, and/or programmed to perform a particular process, function, operation and/or routine according to various features described herein.

The processing circuit 2010 may be a specialized processor, such as an application-specific integrated circuit (ASIC) that serves as a means for (e.g., structure for) carrying out any one of the operations described in conjunction with FIGS. 1-10 and 21-23. The processing circuit 2010 serves as one example of a means for transmitting and/or a means for receiving. In various implementations, the processing circuit 2010 may provide and/or incorporate the functionality of the second wireless communication device 204 (e.g., the decoder 214) of FIG. 2 or the decoder 2404 of FIG. 24.

According to at least one example of the apparatus 2000, the processing circuit 2010 may include one or more of a circuit/module for receiving 2020, a circuit/module for decoding 2022, a circuit/module for sending 2024, a circuit/module for determining a quantity of expected retransmissions 2026, or a circuit/module for determining a time budget 2028. In various implementations, the circuit/module for receiving 2020, the circuit/module for decoding 2022, the circuit/module for sending 2024, the circuit/module for determining a quantity of expected retransmissions 2026, or the circuit/module for determining a time budget 2028 may provide and/or incorporate, at least in part, the functionality described above for the second wireless communication device 204 (e.g., the decoder 214) of FIG. 2 or the decoder 2404 of FIG. 24.

As mentioned above, programming stored by the storage medium 2004, when executed by the processing circuit 2010, causes the processing circuit 2010 to perform one or more of the various functions and/or process operations described herein. For example, the programming may cause the processing circuit 2010 to perform the various functions, steps, and/or processes described herein with respect to FIGS. 1-10 and 21-23 in various implementations. As shown in FIG. 20, the storage medium 2004 may include one or more of code for receiving 2030, code for decoding 2032, code for sending 2034, code for determining a quantity of expected retransmissions 2036, or code for determining a time budget 2038. In various implementations, the code for receiving 2030, the code for decoding 2032, the code for sending 2034, the code for determining a quantity of expected retransmissions 2036, or the code for determining a time budget 2038 may be executed or otherwise used to provide the functionality described herein for the circuit/module for receiving 2020, the circuit/module for decoding 2022, the circuit/module for sending 2024, the circuit/module for determining a quantity of expected retransmissions 2026, or the circuit/module for determining a time budget 2028.

The circuit/module for receiving 2020 may include circuitry and/or programming (e.g., code for receiving 2030 stored on the storage medium 2004) adapted to perform several functions relating to, for example, receiving information. In some scenarios, the circuit/module for receiving 2020 may obtain information (e.g., from the communication interface 2002, the memory device 2008, or some other component of the apparatus 2000) and process (e.g., decode) the information. In some scenarios (e.g., if the circuit/module for receiving 2020 is or includes a radio frequency receiver), the circuit/module for receiving 2020 may receive information directly from a device that transmitted the information. In either case, the circuit/module for receiving 2020 may output the obtained information to another component of the apparatus 2000 (e.g., the circuit/module for decoding 2022, the memory device 2008, or some other component).

The circuit/module for receiving 2020 (e.g., a means for receiving) may take various forms. In some aspects, the circuit/module for receiving 2020 may correspond to, for example, an interface (e.g., a bus interface, a send/receive interface, or some other type of signal interface), a communication device, a transceiver, a receiver, or some other similar component as discussed herein. In some implementations, the communication interface 2002 includes the circuit/module for receiving 2020 and/or the code for receiving 2030. In some implementations, the circuit/module for receiving 2020 and/or the code for receiving 2030 is configured to control the communication interface 2002 (e.g., a transceiver or a receiver) to receive information.

The circuit/module for decoding 2022 may include circuitry and/or programming (e.g., code for decoding 2032 stored on the storage medium 2004) adapted to perform several functions relating to, for example, decoding information. In some aspects, the circuit/module for decoding 2022 (e.g., a means for decoding) may correspond to, for example, a processing circuit.

In some aspects, the circuit/module for decoding 2022 may execute a decoding algorithm. For example, the circuit/module for decoding 2022 may perform an SC decoding algorithm. In some aspects, the circuit/module for encoding 2020 may perform the decoding operations described above in conjunction with FIG. 2. The circuit/module for encoding 2020 then outputs the resulting decoded information (e.g., to the circuit/module for sending 2024, the communication interface 2002, the memory device 2008, or some other component).

The circuit/module for sending 2024 may include circuitry and/or programming (e.g., code for sending 2034 stored on the storage medium 2004) adapted to perform several functions relating to, for example, sending (e.g., transmitting) information. In some implementations, the circuit/module for sending 2024 may obtain information (e.g., from the circuit/module for decoding 2022, the memory device 2008, or some other component of the apparatus 2000), process the information (e.g., encode the information for transmission), and provide the information to another component (e.g., the transmitter 2014, the communication interface 2002, or some other component) that will transmit the information to another apparatus. In some scenarios (e.g., if the circuit/module for sending 2024 includes a transmitter), the circuit/module for sending 2024 transmits the information directly to another apparatus (e.g., the ultimate destination) via radio frequency signaling or some other type of signaling suitable for the applicable communication medium.

The circuit/module for sending 2024 (e.g., a means for sending) may take various forms. In some aspects, the circuit/module for sending 2024 may correspond to, for example, an interface (e.g., a bus interface, a send/receive interface, or some other type of signal interface), a communication device, a transceiver, a transmitter, or some other similar component as discussed herein. In some implementations, the communication interface 2002 includes the circuit/module for sending 2024 and/or the code for sending 2034. In some implementations, the circuit/module for sending 2024 and/or the code for sending 2034 is configured to control the communication interface 2002 (e.g., a transceiver or a transmitter) to send information.

The circuit/module for determining a quantity of expected retransmissions 2026 may include circuitry and/or programming (e.g., code for determining a quantity of expected retransmissions 2036 stored on the storage medium 2004) adapted to perform several functions relating to, for example, determining how many retransmissions may be received. In some aspects, the circuit/module for determining a quantity of expected retransmissions 2026 (e.g., a means for determining a quantity of expected retransmissions) may correspond to, for example, a processing circuit.

The circuit/module for determining a quantity of expected retransmissions 2026 may determine the number of retransmission to expect based on a time budget. Thus, the circuit/module for determining a quantity of expected retransmissions 2026 may obtain time budget information (e.g., from the circuit/module for determining a time budget 2028, the memory device 2008, or some other component of the apparatus 2000). The circuit/module for determining a quantity of expected retransmissions 2026 can then calculate the number of retransmissions based on the time budget information (e.g., by dividing the time budget by the time it takes to complete a retransmission). The circuit/module for determining a quantity of expected retransmissions 2026 may then output an indication of the calculated number of retransmissions (e.g., to the circuit/module for receiving 2020, the memory device 2008, or some other component).

The circuit/module for determining a time budget 2028 may include circuitry and/or programming (e.g., code for determining a time budget 2038 stored on the storage medium 2004) adapted to perform several functions relating to, for example, determining a time budget for retransmissions. In some aspects, the circuit/module for determining a time budget 2028 (e.g., a means for determining a time budget) may correspond to, for example, a processing circuit.

The circuit/module for determining a time budget 2028 may determine the time budget based on the frame structure being used or some other indication of a turn-around time or a communication allocation. Thus, the circuit/module for determining a time budget 2028 may obtain the appropriate input (e.g., from the communication interface 2002, the memory device 2008, or some other component of the apparatus 2000). The circuit/module for determining a time budget 2028 can then calculate the time budget based on input information (e.g., based on the number of frames allocated for transmission prior to a turn-around for reception). The circuit/module for determining a time budget 2028 may then output an indication of the calculated time budget (e.g., to the circuit/module for determining a quantity of expected retransmissions 2026, the memory device 2008, or some other component).

Ninth Example Process

Figure 21:
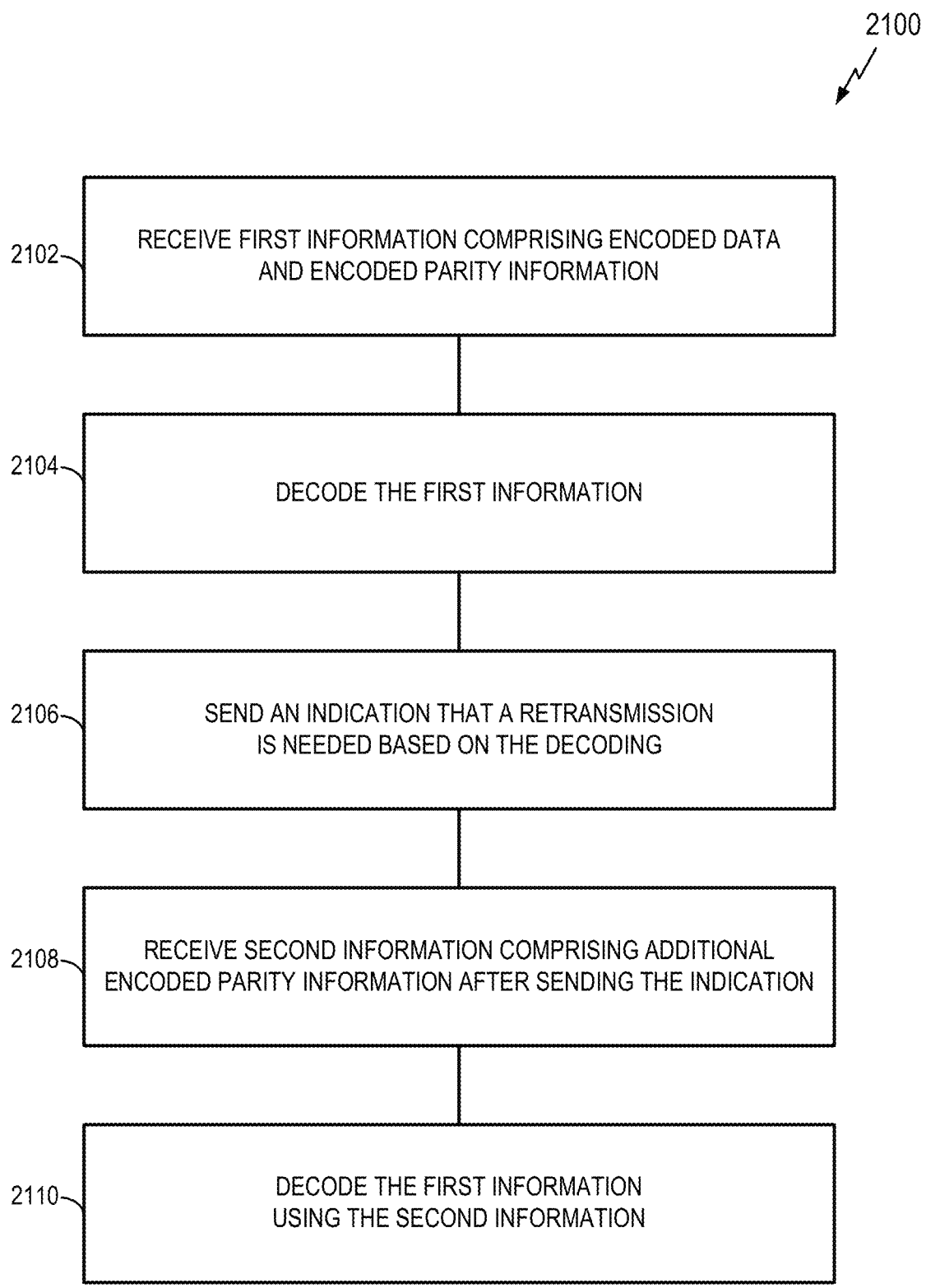
FIG. 21 is a flowchart illustrating an example of a decoding process in accordance with some aspects of the disclosure.

FIG. 21 illustrates a process 2100 for communication in accordance with some aspects of the disclosure. The process 2100 may take place within a processing circuit (e.g., the processing circuit 2010 of FIG. 20), which may be located in a UE, a TRP, an access terminal, a base station, or some other suitable apparatus (e.g., that provides decoding). Of course, in various aspects within the scope of the disclosure, the process 2100 may be implemented by any suitable apparatus capable of supporting communication-related operations.

At block 2102, an apparatus (e.g., a device that includes a decoder) receives first information that includes encoded data and encoded parity information. In some aspects, the encoded data and the encoded parity information may include Polar coded information. In some aspects, the encoded data and the encoded parity information may include systematic Polar coded information.

In some implementations, the circuit/module for receiving 2020 of FIG. 20 performs the operations of block 2102. In some implementations, the code for receiving 2030 of FIG. 20 is executed to perform the operations of block 2102.

At block 2104, the apparatus decodes the first information. For example, the apparatus may include an SC decoder.

In some implementations, the circuit/module for decoding 2022 of FIG. 20 performs the operations of block 2104. In some implementations, the code for decoding 2032 of FIG. 20 is executed to perform the operations of block 2104.

At block 2106, the apparatus sends an indication that a retransmission is needed based on the decoding. For example, the apparatus may send a NAK if the apparatus was not able to successfully decode the first information.

In some implementations, the circuit/module for sending 2024 of FIG. 20 performs the operations of block 2106. In some implementations, the code for sending 2034 of FIG. 20 is executed to perform the operations of block 2106.

At block 2108, the apparatus receives second information including additional encoded parity information. In some aspects, the apparatus may receive the second information after sending the indication at block 2106. In some aspects, the second information may include at least a portion of the encoded parity information. In some aspects, the second information may include at least a portion of the encoded data.

In some aspects, the second information may further include repetition information. In some aspects, the repetition information may include at least a portion of the encoded data. In some aspects, the repetition information may include at least a portion of the encoded parity information.

In some implementations, the circuit/module for receiving 2020 of FIG. 20 performs the operations of block 2108. In some implementations, the code for receiving 2030 of FIG. 20 is executed to perform the operations of block 2108.

At block 2110, the apparatus decodes the first information using the second information. For example, the apparatus may use parity bits from the second information to decide the first information. As another example, the apparatus may perform soft combining.

In some implementations, the circuit/module for decoding 2022 of FIG. 20 performs the operations of block 2110. In some implementations, the code for decoding 2032 of FIG. 20 is executed to perform the operations of block 2110.

In some aspects, the process 2100 may further include receiving at least a third information after the reception of the first information and before the reception of the second information. In some aspects, the reception of the second information may be a final reception associated with the first information (e.g., a final reception of the HARQ process associated with transmission of the first information).

In some aspects, the process 2100 may further include determining an expected quantity of expected retransmissions based on a time budget. For example, the apparatus may receive an indication of the time budget and determine the quantity of expected retransmission based on the duration of a retransmission (e.g., the maximum amount of time that a retransmission would take).

In some aspects, the process 2100 may include any combination of two or more of the above features.

Tenth Example Process

Figure 22:
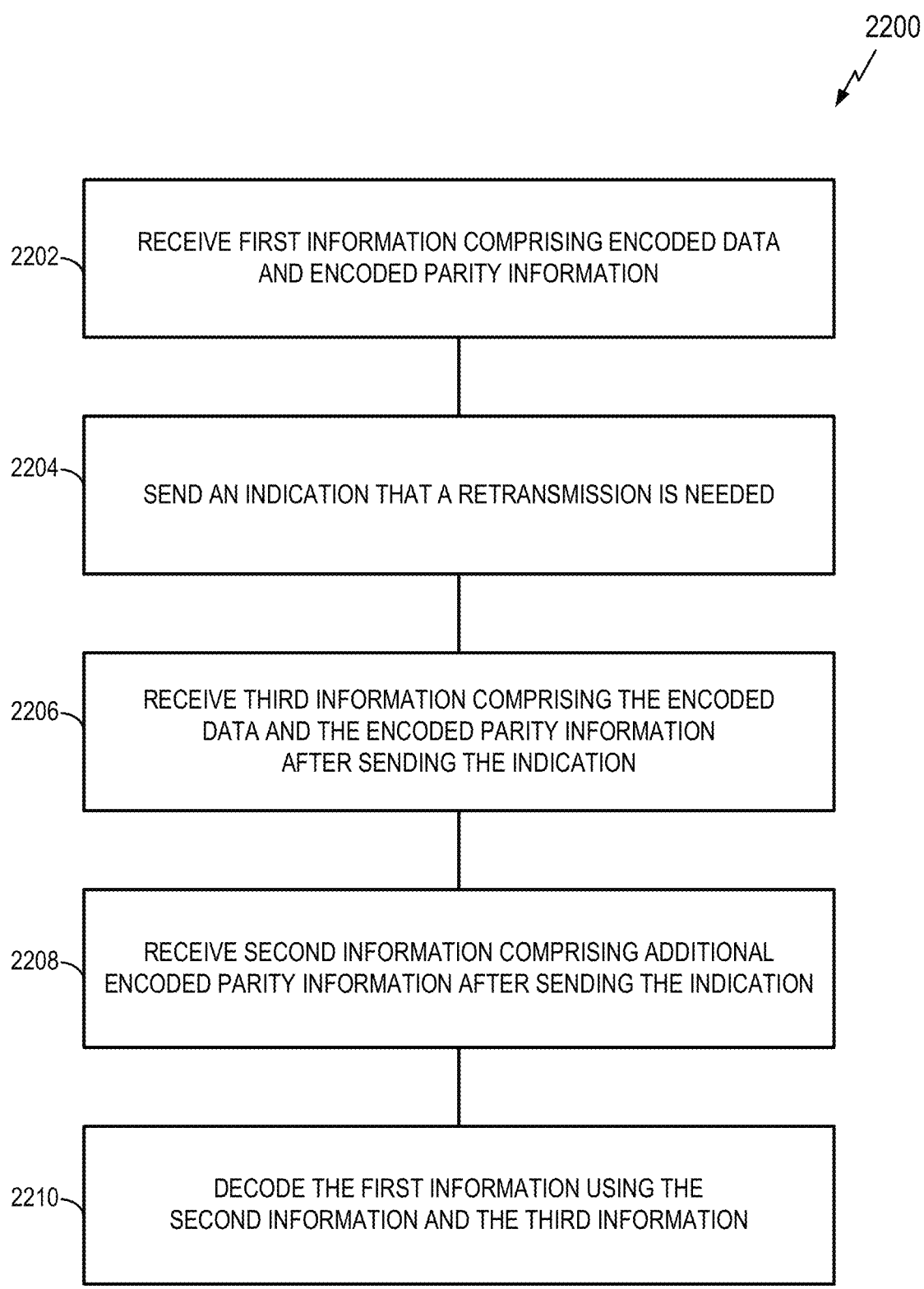
FIG. 22 is a flowchart illustrating an example of a decoding process for multiple transmissions in accordance with some aspects of the disclosure.

FIG. 22 illustrates a process 2200 for communication in accordance with some aspects of the disclosure. One or more aspects of the process 2200 may be used in conjunction with (e.g., in addition to or as part of) the process 2100 of FIG. 21. The process 2200 may take place within a processing circuit (e.g., the processing circuit 2010 of FIG. 20), which may be located in a UE, a TRP, an access terminal, a base station, or some other suitable apparatus (e.g., that provides decoding). Of course, in various aspects within the scope of the disclosure, the process 2200 may be implemented by any suitable apparatus capable of supporting communication-related operations.

At block 2202, an apparatus (e.g., a device that includes a decoder) receives first information that includes encoded data and encoded parity information. In some aspects, the operations of block 2202 may correspond to the operations of block 2102 of FIG. 21.

In some implementations, the circuit/module for receiving 2020 of FIG. 20 performs the operations of block 2202. In some implementations, the code for receiving 2030 of FIG. 20 is executed to perform the operations of block 2202.

At block 2204, the apparatus sends an indication that a retransmission is needed. In some aspects, the operations of block 2204 may correspond to the operations of block 2106 of FIG. 21. Thus, the apparatus may send a NAK if the apparatus was not able to successfully decode the first information.

In some implementations, the circuit/module for sending 2024 of FIG. 20 performs the operations of block 2204. In some implementations, the code for sending 2034 of FIG. 20 is executed to perform the operations of block 2204.

At block 2206, the apparatus receives third information after sending the indication. In some aspects, the third information may include a copy of the encoded data and the encoded parity information that was sent by an encoding apparatus in the first information.

In some implementations, the circuit/module for receiving 2020 of FIG. 20 performs the operations of block 2206. In some implementations, the code for receiving 2030 of FIG. 20 is executed to perform the operations of block 2206.

At block 2208, the apparatus receives second information. In some aspects, the operations of block 2208 may correspond to the operations of block 2108 of FIG. 21. Thus, the reception of the second information may be a final reception associated with the first information (e.g., a final reception of the HARQ process associated with transmission of the first information).

In some aspects, the second information may include at least a portion of the encoded parity information. In some aspects, the second information may include at least a portion of the encoded data.

In some aspects, the second information may further include repetition information. In some aspects, the repetition information may include at least a portion of the encoded data. In some aspects, the repetition information may include at least a portion of the encoded parity information.

In some implementations, the circuit/module for receiving 2020 of FIG. 20 performs the operations of block 2208. In some implementations, the code for receiving 2030 of FIG. 20 is executed to perform the operations of block 2208.

At block 2210, the apparatus decodes the first information using the second information. In some aspects, the operations of block 2210 may correspond to the operations of block 2110 of FIG. 21.

In some implementations, the circuit/module for decoding 2022 of FIG. 20 performs the operations of block 2210. In some implementations, the code for decoding 2032 of FIG. 20 is executed to perform the operations of block 2210.

In some aspects, the process 2200 may further include determining an expected quantity of expected retransmissions based on a time budget.

In some aspects, the process 2200 may include any combination of two or more of the above features.

Eleventh Example Process

Figure 23:
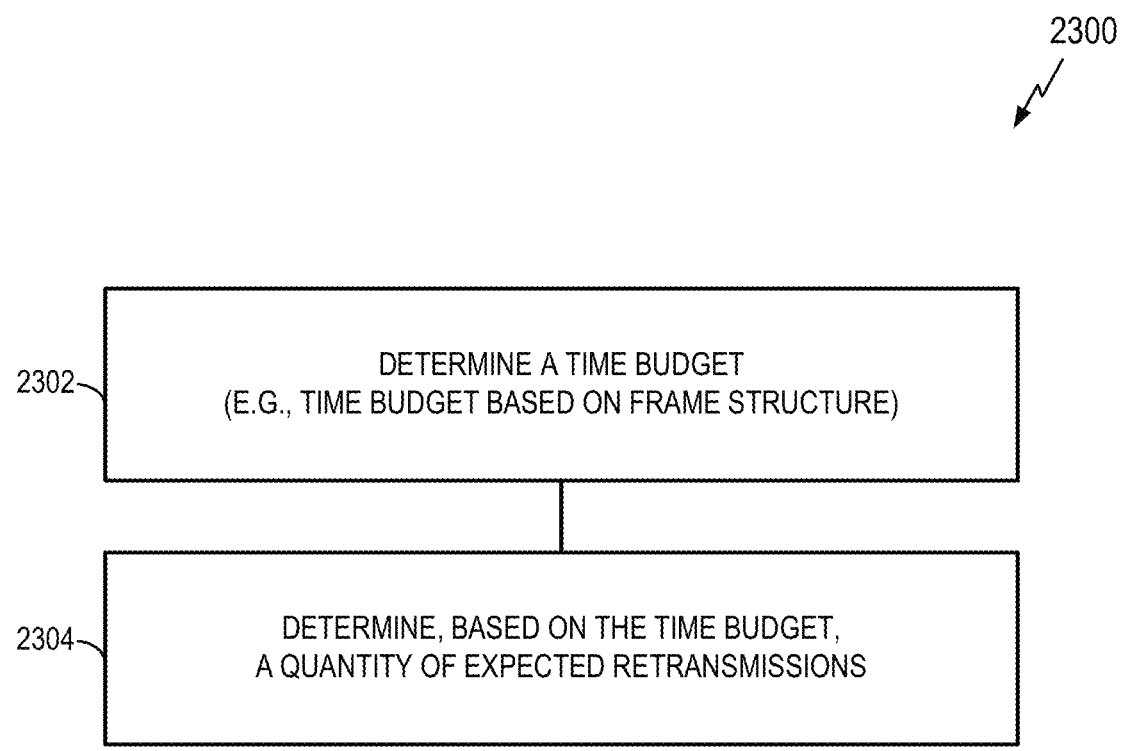
FIG. 23 is a flowchart illustrating an example of a process for determining a quantity of expected retransmissions in accordance with some aspects of the disclosure.

FIG. 23 illustrates a process 2300 for communication in accordance with some aspects of the disclosure. One or more aspects of the process 2300 may be used in conjunction with (e.g., in addition to or as part of) the process 2100 of FIG. 21 and/or the process 2200 of FIG. 22. The process 2300 may take place within a processing circuit (e.g., the processing circuit 2010 of FIG. 20), which may be located in a UE, a TRP, an access terminal, a base station, or some other suitable apparatus (e.g., that provides decoding). Of course, in various aspects within the scope of the disclosure, the process 2300 may be implemented by any suitable apparatus capable of supporting communication-related operations.

At block 2302, an apparatus (e.g., a device that includes a decoder) determines a time budget. For example, the apparatus may receive an indication of the time budget (e.g., from an encoding apparatus or a scheduling entity) or calculate the time budget.

In some implementations, the circuit/module for determining a time budget 2028 of FIG. 20 performs the operations of block 2302. In some implementations, the code for determining a time budget 2038 of FIG. 20 is executed to perform the operations of block 2302.

At block 2304, the apparatus determines, based on the time budget, a quantity of expected retransmissions. In some aspects, receipt of the first information (e.g., at block 2102 of FIG. 21) is associated with a first transmission, such that the quantity of expected retransmissions is associated with the first transmission. In some aspects, the apparatus may determine the quantity of expected retransmissions by dividing the time budget by the duration of a retransmission (e.g., the maximum amount of time that a retransmission would take).

In some implementations, the circuit/module for determining a quantity of expected retransmissions 2026 of FIG. 20 performs the operations of block 2304. In some implementations, the code for determining a quantity of expected retransmissions 2036 of FIG. 20 is executed to perform the operations of block 2304.

In some aspects, the process 2300 may include any combination of two or more of the above features.

Example Encoder and Decoder

Figure 24:
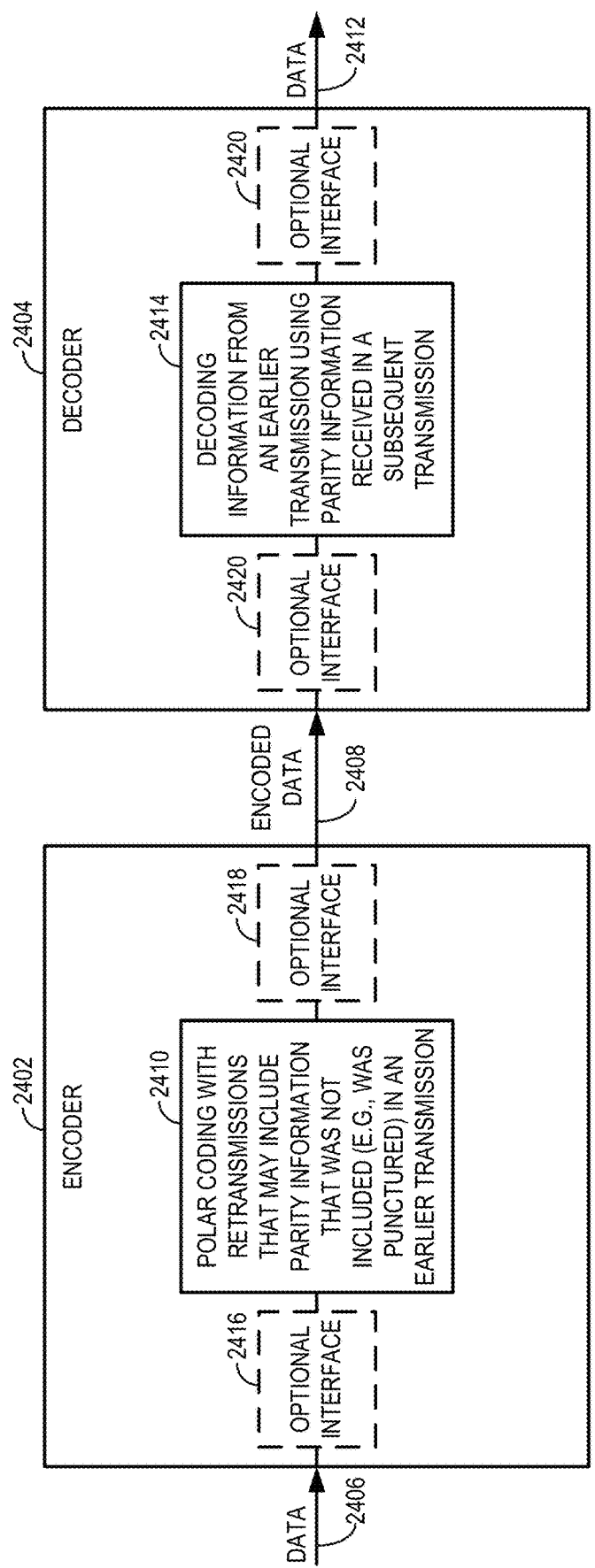
FIG. 24 is a block diagram of an example encoder and an example decoder in accordance with some aspects of the disclosure.

FIG. 24 illustrates an example encoder 2402 and an example decoder 2404 constructed in accordance with the teachings herein. In some aspects, the encoder 2402 and the decoder 2404 may correspond to the encoder 212 and the decoder 214 of FIG. 2, respectively.

The encoder 2402 encodes data 2406 to generate encoded data 2408. In accordance with the teachings herein, the encoder 2402 may include functionality for Polar coding with retransmissions that may include parity information that was not included (e.g., was punctured) in an earlier transmission 2410.

The decoder 2404 decodes the encoded data 2408 (e.g., after transmission over a communication channel, not shown) to provide recovered data 2412. In accordance with the teachings herein, the decoder 2404 may include functionality for decoding information from an earlier transmission using parity information received in a subsequent transmission 2414. As discussed above, in a typical implementation, the parity information was not included (e.g., was punctured) in the earlier transmission.

In some implementations, the encoder 2402 may include an interface 2416, an interface 2418, or both. Similarly, the decoder 2404 may include an interface 2420, an interface 2422, or both. An interface may include, for example, an interface bus, bus drivers, bus receivers, other suitable circuitry, or a combination thereof. For example, the interface 2416 or the interface 2420 may include receiver devices, buffers, or other circuitry for receiving a signal. As another example, the interface 2418 or the interface 2422 may include output devices, drivers, or other circuitry for sending a signal. In some implementations, the interfaces 2416 and 2418 may be configured to interface one or more other components of the encoder 2402 (other components not shown in FIG. 24). Similarly, the interfaces 2420 and 2422 may be configured to interface one or more other components of the decoder 2404 (other components not shown in FIG. 24).

The encoder 2402 and the decoder 2404 may take different forms in different implementations. In some cases, the encoder 2402 and/or the decoder 2404 may be an integrated circuit. In some cases, the encoder 2402 and/or the decoder 2404 may be included in an integrated circuit that includes other circuitry (e.g., a processor and related circuitry).

Additional Aspects

The examples set forth herein are provided to illustrate certain concepts of the disclosure. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

As those skilled in the art will readily appreciate, various aspects described throughout this disclosure may be extended to any suitable telecommunication system, network architecture, and communication standard. By way of example, various aspects may be applied to wide area networks, peer-to-peer network, local area network, other suitable systems, or any combination thereof, including those described by yet-to-be defined standards. Various aspects may be applied to 3GPP 5G systems and/or other suitable systems, including those described by yet-to-be defined wide area network standards. Various aspects may also be applied to systems using LTE (in FDD, TDD, or both modes), LTE-Advanced (LTE-A) (in FDD, TDD, or both modes), Universal Mobile Telecommunications System (UMTS), Global System for Mobile Communications (GSM), Code Division Multiple Access (CDMA), CDMA2000, Evolution-Data Optimized (EV-DO), Ultra Mobile Broadband (UMB), IEEE 802.11 (Wi-Fi), IEEE 802.16 (WiMAX), IEEE 802.20, Ultra-Wideband (UWB), Bluetooth, and/or other suitable systems. Various aspects may also be applied to UMTS systems such as W-CDMA, TD-SCDMA, and TD-CDMA. The actual telecommunication standard, network architecture, and/or communication standard used will depend on the specific application and the overall design constraints imposed on the system.

Many aspects are described in terms of sequences of actions to be performed by, for example, elements of a computing device. It will be recognized that various actions described herein can be performed by specific circuits, for example, central processing units (CPUs), graphic processing units (GPUs), digital signal processors (DSPs), application specific integrated circuits (ASICs), field programmable gate arrays (FPGAs), or various other types of general purpose or special purpose processors or circuits, by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

One or more of the components, steps, features and/or functions illustrated in above may be rearranged and/or combined into a single component, step, feature or function or embodied in several components, steps, or functions. Additional elements, components, steps, and/or functions may also be added without departing from novel features disclosed herein. The apparatus, devices, and/or components illustrated above may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of example processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The methods, sequences or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An example of a storage medium is coupled to the processor such that the processor can read information from, and write information to, the storage medium. In the alternative, the storage medium may be integral to the processor.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

The terminology used herein is for the purpose of describing particular aspects only and is not intended to be limiting of the aspects. As used herein, the singular forms "a," "an" and "the" are intended to include the plural forms as well, unless the context clearly indicates otherwise. It will be further understood that the terms "comprises," "comprising," "includes" or "including," when used herein, specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of a, b, or c" or "a, b, c, or any combination thereof" used in the description or the claims means "a or b or c or any combination of these elements." For example, this terminology may include a, or b, or c, or a and b, or a and c, or a and b and c, or 2a, or 2b, or 2c, or 2a and b, and so on.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

While the foregoing disclosure shows illustrative aspects, it should be noted that various changes and modifications could be made herein without departing from the scope of the appended claims. The functions, steps or actions of the method claims in accordance with aspects described herein need not be performed in any particular order unless expressly stated otherwise. Furthermore, although elements may be described or claimed in the singular, the plural is contemplated unless limitation to the singular is explicitly stated.

What is claimed is:

1. A method of communication for transmitting first information and second information, comprising:
    selecting a first coding rate to meet a target error rate for the transmission of the second information;
    encoding, according to the first coding rate that was selected to meet the target error rate for the transmission of the second information, first data to generate encoded data and encoded parity information;
    selecting a second coding rate to meet a target error rate for the transmission of the first information;
    transmitting first information comprising the encoded data and a portion of the encoded parity information, the portion of the encoded parity information obtained by puncturing the encoded parity information according to the second coding rate that was selected to meet the target error rate for the transmission of the first information;
    determining that a retransmission is needed; and
    transmitting the second information, the second information comprising the encoded parity information as a result of the determination that a retransmission is needed.

2. The method of claim 1, further comprising:
    transmitting at least a third information after the transmission of the first information and before the transmission of the second information.

3. The method of claim 2, wherein the transmission of the second information is a final transmission for the first data.

4. The method of claim 1, further comprising:
    determining a condition of a channel over a period to time,
    wherein the first coding rate is selected based on the condition of the channel,
    wherein the first information is transmitted over the channel, and
    wherein the second information is transmitted over the channel.

5. The method of claim 1, wherein the second information further comprises repetition information that comprises the encoded data.

6. The method of claim 5, further comprising:
    comparing the first coding rate to the second coding rate; and
    before transmitting the second information that further comprises the repetition information, determining, based on the comparison, to transmit the repetition information.

7. The method of claim 5, further comprising:
    determining a quantity of bits for the repetition information based on the first coding rate.

8. The method of claim 1, further comprising:
    determining a time budget; and
    selecting, based on the time budget, a quantity of retransmissions associated with the transmission of the first information.

9. The method of claim 1, wherein the encoding comprises Polar coding.

10. The method of claim 1, wherein the encoding comprises systematic Polar coding.

11. An apparatus for communication for transmitting first information and second information, comprising:
    a memory; and
    a processor coupled to the memory,
    the processor and the memory configured to:
        select a first coding rate to meet a target error rate for the transmission of the second information;
        encode, according to the first coding rate that was selected to meet the target error rate for the transmission of the second information, first data to generate encoded data and encoded parity information;
        select a second coding rate to meet a target error rate for the transmission of the first information;
        transmit first information comprising the encoded data and a portion of the encoded parity information, the portion of the encoded parity information obtained by puncturing the encoded parity information according to the second coding rate that was selected to meet the target error rate for the transmission of the first information;

determine that a retransmission is needed; and transmit the second information, the second information comprising the encoded parity information as a result of the determination that a retransmission is needed.

12. The apparatus of claim 11, wherein the processor and the memory are further configured to:

transmit at least a third information after the transmission of the first information and before the transmission of the second information.

13. The apparatus of claim 12, wherein the transmission of the second information is a final transmission for the first data.

14. The apparatus of claim 11, wherein the processor and the memory are further configured to:

determine a condition of a channel over a period to time, wherein the first coding rate is selected based on the condition of the channel, wherein the first information is transmitted over the channel, and wherein the second information is transmitted over the channel.

15. The apparatus of claim 11, wherein the second information further comprises repetition information that comprises the encoded data.

16. The apparatus of claim 15, wherein the processor and the memory are further configured to:

compare the first coding rate to the second coding rate; and before transmitting the second information that further comprises the repetition information, determine, based on the comparison, to transmit the repetition information.

17. The apparatus of claim 15, wherein the processor and the memory are further configured to:

determine a quantity of bits for the repetition information based on the first coding rate.

18. The apparatus of claim 11, wherein the processor and the memory are further configured to:

determine a time budget; and select, based on the time budget, a quantity of retransmissions associated with the transmission of the first information.

19. The apparatus of claim 11, wherein the encoding comprises Polar coding.

20. The apparatus of claim 11, wherein the encoding comprises systematic Polar coding.

21. An apparatus for communication for transmitting first information and second information, comprising:

means for selecting a first coding rate to meet a target error rate for the transmission of the second information;

means for encoding, according to the first coding rate that was selected to meet the target error rate for the transmission of the second information, first data to generate encoded data and encoded parity information;

means for selecting a second coding rate to meet a target error rate for the transmission of the first information;

means for transmitting first information comprising the encoded data and a portion of the encoded parity information, the portion of the encoded parity information obtained by puncturing the encoded parity information according to the second coding rate that was selected to meet the target error rate for the transmission of the first information;

means for determining that a retransmission is needed; and means for transmitting the second information, the second information comprising the encoded parity information as a result of the determination that a retransmission is needed.

22. A non-transitory computer-readable medium storing computer-executable code, including code to:

select a first coding rate to meet a target error rate for the transmission of the second information;

encode, according to the first coding rate that was selected to meet the target error rate for the transmission of the second information, first data to generate encoded data and encoded parity information;

select a second coding rate to meet a target error rate for the transmission of the first information;

transmit first information comprising the encoded data and a portion of the encoded parity information, the portion of the encoded parity information obtained by puncturing the encoded parity information according to the second coding rate that was selected to meet the target error rate for the transmission of the first information;

determine that a retransmission is needed; and transmit the second information, the second information comprising the encoded parity information as a result of the determination that a retransmission is needed.

* * * * *